(12) United States Patent
Schulz et al.

(10) Patent No.: US 11,223,528 B2
(45) Date of Patent: Jan. 11, 2022

(54) MANAGEMENT OF CLOUD-BASED SHARED CONTENT USING PREDICTIVE COST MODELING

(71) Applicant: Box, Inc., Redwood City, CA (US)

(72) Inventors: Randall Roy Schulz, Mountain View, CA (US); Mark Storer, Redwood City, CA (US)

(73) Assignee: Box. Inc., Redwood City, CA (US)

( * ) Notice: Subject to any disclaimer, the term of this patent is extended or adjusted under 35 U.S.C. 154(b) by 458 days.

(21) Appl. No.: 15/418,566

(22) Filed: Jan. 27, 2017

(65) Prior Publication Data

US 2018/0219737 A1 Aug. 2, 2018

(51) Int. Cl.
*G06F 16/11* (2019.01)
*H04L 29/08* (2006.01)
(Continued)

(52) U.S. Cl.
CPC ........ *H04L 41/0826* (2013.01); *G06F 16/119* (2019.01); *G06F 16/122* (2019.01);
(Continued)

(58) Field of Classification Search
CPC . H04L 41/0826; H04L 41/145; H04L 41/147; H04L 67/1097; H04L 41/5019;
(Continued)

(56) References Cited

U.S. PATENT DOCUMENTS 5,832,126 A * 11/1998 Tanaka ...................... G06T 9/00
382/239

6,260,192 B1 * 7/2001 Rosin ................. H04N 5/44543
348/E5.002

(Continued)

FOREIGN PATENT DOCUMENTS

WO 2016134627 A1 9/2016

OTHER PUBLICATIONS

International Search Report and Written Opinion dated May 11, 2018 for PCT Appln. No. PCT/US18/15621.

(Continued)

*Primary Examiner* — Irete F Ehichioya
*Assistant Examiner* — Huen Wong
(74) *Attorney, Agent, or Firm* — Vista IP Law Group, LLP

(57) ABSTRACT

Systems and methods for managing content in a cloud-based service platform. A method embodiment operates over storage content objects stored in storage devices in a cloud-based shared content management system. The method commences upon identifying a source object and identifying derivative objects that are generated based properties of the source object. After a time, candidate eviction objects are identified. One form of analysis is performed over source objects and another form of analysis is performed over derivative objects. Derivative objects are classified using the analysis, which classification is used to determine object management commands associated with the derivative object such as to remove the derivative object from one storage location (e.g., in a high-performance storage filer) and relocate it to another (e.g., lower cost) storage location. Based on the analysis, a derivative object might be deleted completely and then regenerated at a later time if/when needed.

22 Claims, 11 Drawing Sheets

(51) Int. Cl.
*H04L 12/26* (2006.01)
*H04L 12/24* (2006.01)
*G06F 30/20* (2020.01)

(52) U.S. Cl.
CPC .......... *G06F 16/125* (2019.01); *G06F 16/128* (2019.01); *G06F 30/20* (2020.01); *H04L 41/145* (2013.01); *H04L 41/147* (2013.01); *H04L 67/1097* (2013.01); *H04L 41/5019* (2013.01); *H04L 43/08* (2013.01); *H04L 43/16* (2013.01)

(58) Field of Classification Search
CPC ..... H04L 43/16; H04L 43/08; G06F 17/5009; G06F 11/1448; G06F 16/122; G06F 16/125; G06F 16/128; G06F 16/119
USPC .......................................................... 707/692
See application file for complete search history.

(56) References Cited

U.S. PATENT DOCUMENTS

| | | | | |
|---|---|---|---|---|
| 6,583,799 | B1* | 6/2003 | Manolis | H04N 1/00204 715/838 |
| 6,978,378 | B1* | 12/2005 | Koretz | G06F 3/0481 713/193 |
| 7,536,512 | B2* | 5/2009 | Chetuparambil | G06F 12/121 711/131 |
| 8,966,184 | B2* | 2/2015 | Atkisson | G06F 3/0655 711/133 |
| 9,063,898 | B1* | 6/2015 | Merchant | G06F 11/1469 |
| 9,569,367 | B1* | 2/2017 | Wigmore | G06F 12/0891 |
| 10,114,836 | B1* | 10/2018 | Meyer | H04L 67/06 |
| 10,162,709 | B1* | 12/2018 | Lazier | G06F 11/1451 |
| 2004/0260898 | A1* | 12/2004 | Stanley | G06F 11/1451 711/162 |
| 2005/0084236 | A1* | 4/2005 | Itoh | G11B 27/034 386/326 |
| 2005/0283630 | A1* | 12/2005 | Shikata | G06F 1/3203 713/322 |
| 2008/0235517 | A1* | 9/2008 | Ohmori | H04L 9/0891 713/187 |
| 2010/0077146 | A1* | 3/2010 | Hosoda | G06F 12/0862 711/125 |
| 2012/0233117 | A1* | 9/2012 | Holt | H04L 67/06 707/620 |
| 2012/0278578 | A1 | 11/2012 | Castillo et al. | |
| 2013/0054523 | A1* | 2/2013 | Anglin | G06F 16/27 707/624 |
| 2013/0110969 | A1* | 5/2013 | Wertheimer | G06F 11/1448 709/216 |
| 2013/0232254 | A1 | 9/2013 | Srikanth et al. | |
| 2014/0019577 | A1 | 1/2014 | Lobo et al. | |
| 2014/0082288 | A1* | 3/2014 | Beard | G06F 3/0671 711/123 |
| 2014/0279854 | A1* | 9/2014 | Scanlon | G06F 16/162 707/609 |
| 2015/0039831 | A1* | 2/2015 | Auvenshine | G06F 3/0643 711/118 |
| 2015/0172120 | A1* | 6/2015 | Dwarampudi | H04L 67/1097 709/221 |
| 2016/0012065 | A1* | 1/2016 | Takata | H04L 63/0407 707/756 |
| 2016/0072889 | A1* | 3/2016 | Jung | H04L 67/1097 |
| 2016/0255169 | A1* | 9/2016 | Kovvuri | G06F 12/126 709/219 |
| 2016/0321311 | A1 | 11/2016 | Tallamraju et al. | |
| 2017/0168903 | A1* | 6/2017 | Dornemann | G06F 9/45558 |
| 2018/0293021 | A1* | 10/2018 | Fossen | H04L 67/1097 |

OTHER PUBLICATIONS

Foreign Office Action dated Nov. 18, 2020 for EP Appln. No. 18744806.3.

* cited by examiner

MANAGEMENT OF CLOUD-BASED SHARED CONTENT USING PREDICTIVE COST MODELING

FIELD

This disclosure relates to managing content in a cloud-based service platform, and more particularly to techniques for management of cloud-based shared content using predictive modeling.

BACKGROUND

Cloud-based content management services and platforms have impacted the way personal and corporate electronically stored information objects (e.g., files, images, videos, etc.) are stored, and has also impacted the way such personal and corporate content is shared and managed. One benefit of using cloud-based platforms is the ability to securely share content among trusted collaborators who access shared content from a variety of user devices such as mobile phones, tablets, laptop computers, desktop computers, and/or other devices from any geographic location. Such collaboration is facilitated by cloud-based content management service providers that manage access to various storage facilities that store the content objects created and/or uploaded by the collaborators.

Such storage facilities often comprise various types of storage appliances (e.g., network-attached storage (NAS) filers, distributed access and versioning (DAV) filers, cloud-accessible appliances, backup tape reader/writers, etc.) each of which have respective performance characteristics and associated costs. The aforementioned appliances store not only the source content objects provided by the collaborators, but they also store derivative content objects (e.g., derived objects) associated with the source content objects. For example, a PDF document that has been uploaded for sharing by multiple collaborators might have derived content objects (e.g., thumbnail images of each page) that have been generated for that document. Such derived content objects often include thumbnails, preview pages, index metadata, backup copies, and/or other derivative objects. In some cases, multiple duplicate copies (e.g., multiple backup copies) of a particular source content object might also be generated and stored (e.g., in accordance with a service level agreement (SLA) and/or other data retention policy).

As the proliferation of cloud-based content management services and adoption of cloud-based collaboration rapidly increases, so does the growth in the number of source content objects and their associated derivative content objects. As such, the storage capacity to store such objects also increases as do the capital and ongoing costs incurred to purchase and maintain the needed storage capacity.

Unfortunately, storage costs are often incurred to store content objects that are seldom accessed, or no longer being accessed, or even not ever accessed at all. Such content objects can be referred to as being "warm" or being "cold", depending on the access pattern. Conversely, a content object that is frequently accessed can be referred to as being "hot". For example, a file comprising a "daily tally" that is accessed by members of a corporate department might be referred to as being "hot", whereas, for example, a file comprising "last year's roll-up" that might no longer have relevance might be referred to as being "cold". As additional examples, certain derivative content objects (thumbnails, etc.) that had been generated with respect to an associated source content object can become "cold" even though the source content object may remain "warm" or "hot". In these cases, relatively higher capital costs and operating costs associated with storing cold content objects in high performance appliances are incurred—even though there is no or little benefit to storing in such high performance appliances.

Some naïve approaches to storing cold content merely continue to deploy additional high performance appliances (e.g., additional filers, etc.) to accommodate the expanding corpus of source and derivative content objects. Such a naïve approach results in additional storage costs pertaining to the content objects that are considered cold. What is needed is a technological solution for managing storage capacity in the presence of a highly dynamic corpus of source and derivative storage objects in the context of a cloud-based content management environment.

What is needed is a technique or techniques to improve over legacy techniques and/or over other considered approaches. Some of the approaches described in this background section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY

The present disclosure provides a detailed description of techniques used in systems, methods, and in computer program products for management of cloud-based shared content, which techniques advance the relevant technologies to address technological issues with legacy approaches. More specifically, the present disclosure provides a detailed description of techniques used in systems, methods, and in computer program products for managing cloud-based shared content using predictive modeling. Certain embodiments are directed to technological solutions that apply a rule base and a predictive model to a set of content objects so as to identify one or more content management actions to be taken, such as deletion from one storage device (e.g., a high performance storage filer) and movement to a different location (e.g., onto lower-cost storage media).

The disclosed embodiments modify and improve over legacy approaches. In particular, the herein-disclosed techniques provide technical solutions that address the technical problems attendant to the ongoing problem of meeting high performance storage requirements in the presence of a highly dynamic corpus of shared content objects in a cloud-based content management environment. Such technical solutions relate to improvements in computer functionality. Various applications of the herein-disclosed improvements in computer functionality serve to reduce the demand for computer memory, reduce the demand for computer processing power, reduce network bandwidth use, and reduce the demand for inter-component communication. Some embodiments disclosed herein use techniques to improve the functioning of multiple systems within the disclosed environments, and some embodiments advance peripheral technical fields as well. As one specific example, use of the disclosed techniques and devices within the shown environments as depicted in the figures provide advances in the technical field of high performance online collaboration systems as well as advances in various technical fields related to data storage.

Further details of aspects, objectives, and advantages of the technological embodiments are described herein and in the drawings and claims.

BRIEF DESCRIPTION OF THE DRAWINGS

The drawings described below are for illustration purposes only. The drawings are not intended to limit the scope of the present disclosure

DETAILED DESCRIPTION

Figure 1A:
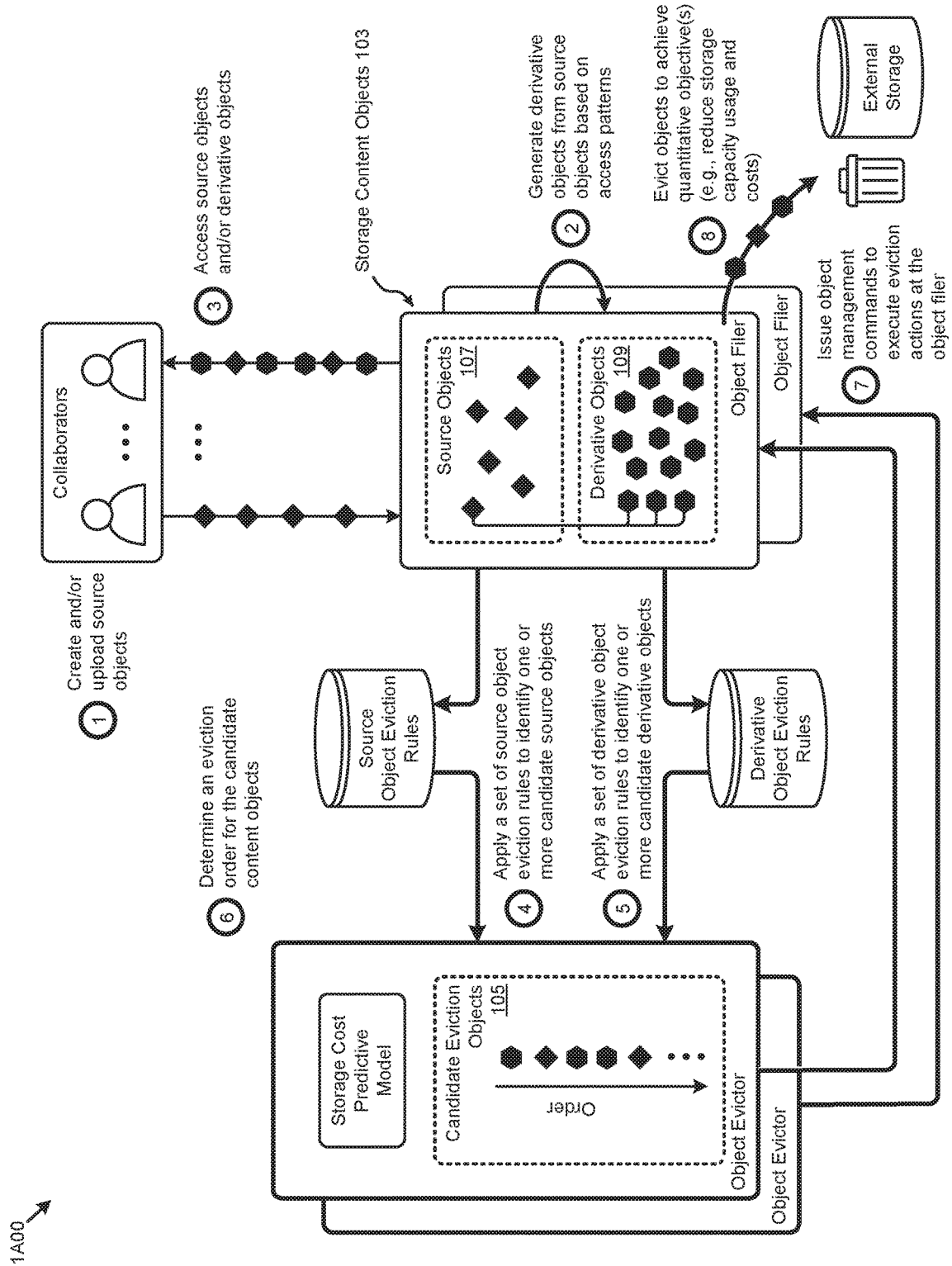
FIG. 1A depicts usage of a cloud-based storage capacity reduction technique, according to an embodiment.

Embodiments in accordance with the present disclosure address the problem of managing highly-available storage appliances in the presence of a highly dynamic corpus of shared content objects in a cloud-based content management environment. The accompanying figures and discussions herein present example environments, systems, methods, and computer program products.

Overview

Disclosed herein are techniques for applying a rule base and a predictive model to a set of content objects so as to identify one or more object management commands that serve to achieve one or more quantitative objectives (e.g., such as reduction in aggregate costs) while still achieving a given quantitative performance level (e.g., such as adhering to performance specifications of a service level agreement (SLA)). In certain embodiments, a set of eviction rules are applied to the storage content objects (e.g., source objects, derivative objects, etc.) at each of a plurality of filer appliances to identify a set of candidate eviction objects and corresponding object management commands (e.g., a command to delete, a command to relocate, a command to compress, etc.). A cost model is consulted with respect to each candidate eviction object to generate predicted costs, specifically: (1) a predicted retention cost (e.g., storage cost, computing cost, transmission cost, etc.) that pertains to processing the candidate eviction object at the filer appliance, and (2) a predicted disposal cost that pertains to removing the candidate eviction object from the filer appliance.

As used herein, candidate eviction objects are objects (e.g., files, data, etc.) that are stored in or on a storage device. For managing ongoing storage of objects, candidate eviction objects are ranked by a cost reduction score that is assigned to each of the candidate eviction objects based on the difference between the predicted retention cost (e.g., ongoing storage costs, etc.) and the predicted disposal cost (e.g., one-time removal cost, regeneration costs, etc.). For example, if a predicted retention cost for an object is higher than the predicted disposal (and possible regeneration) cost, then that object might become a candidate for disposal.

When certain events or signals are detected (e.g., an event arising from a storage device capacity utilization threshold breach), a corresponding set of object management commands pertaining to some or all of the candidate eviction objects are executed, possibly in a prescribed sequence or execution order corresponding to a ranking. In some embodiments, multiple object management commands for certain candidate eviction objects are issued to, for example, fortify the candidate eviction objects before removing the objects. As used herein, object management commands are computer instructions that are able to be carried out by a computer to cause one or more storage actions to be performed on a storage object. Such object management commands can be carried out by a filer, or by any server or other compute-capable entity. Object management commands are often raised as a result of storage subsystem activities.

In some embodiments, a set of filer activity data (e.g., filer access patterns, miss history, etc.) is recorded to facilitate candidate eviction object identification and/or for scoring and/or for ranking and/or to prescribe a command execution order. In some embodiments, removed content objects are restored (e.g., reloaded, regenerated, etc.) to the filer appliance based on observed filer activity. In some embodiments, the object management command execution is halted when certain conditions triggering the eviction event signal have changed (e.g., the capacity utilization threshold is no longer breached).

Definitions and Use of Figures

Some of the terms used in this description are defined below for easy reference. The presented terms and their respective definitions are not rigidly restricted to these definitions—a term may be further defined by the term's use within this disclosure. The term "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application and the appended claims, the term "or" is intended to mean an inclusive "or" rather than an exclusive "or". That is, unless specified otherwise, or is clear from the context, "X employs A or B" is intended to mean any of the natural inclusive permutations. That is, if X employs A, X employs B, or X employs both A and B, then "X employs A or B" is satisfied under any of the foregoing instances. As used herein, at least one of A or B means at least one of A, or at least one of B, or at least one of both A and B. In other words, this phrase is disjunctive. The articles "a" and "an" as used in this application and the appended claims should generally be construed to mean "one or more" unless specified otherwise or is clear from the context to be directed to a singular form.

Various embodiments are described herein with reference to the figures. It should be noted that the figures are not necessarily drawn to scale and that elements of similar structures or functions are sometimes represented by like reference characters throughout the figures. It should also be noted that the figures are only intended to facilitate the description of the disclosed embodiments—they are not representative of an exhaustive treatment of all possible embodiments, and they are not intended to impute any limitation as to the scope of the claims. In addition, an illustrated embodiment need not portray all aspects or advantages of usage in any particular environment.

An aspect or an advantage described in conjunction with a particular embodiment is not necessarily limited to that embodiment and can be practiced in any other embodiments even if not so illustrated. References throughout this specification to "some embodiments" or "other embodiments" refer to a particular feature, structure, material or characteristic described in connection with the embodiments as being included in at least one embodiment. Thus, the appearance of the phrases "in some embodiments" or "in other embodiments" in various places throughout this specification are not necessarily referring to the same embodiment or embodiments. The disclosed embodiments are not intended to be limiting of the claims.

Descriptions of Example Embodiments

FIG. 1A depicts usage of a cloud-based storage capacity reduction technique 1A00. As an option, one or more variations of cloud-based storage capacity reduction technique 1A00 or any aspect thereof may be implemented in the context of the architecture and functionality of the embodiments described herein. The cloud-based storage capacity reduction technique 1A00 or any aspect thereof may be implemented in any environment.

The cloud-based storage capacity reduction technique 1A00 presented in FIG. 1A illustrates one embodiment of techniques for dynamically managing cloud-based shared content using a rule base and/or predictive modeling. Such techniques described herein address the problems attendant to minimizing highly-available storage requirements in the presence of a highly dynamic corpus of shared content objects in a cloud-based content management environment. In certain distributed computing environments, multiple instances of object filers (e.g., filer appliances, DAV filers, filers, etc.) are implemented to store content objects that can be accessed by various collaborators. In some cases, a replica of some of the content objects can be stored at an external storage facility (e.g., Amazon S3) for data loss protection in compliance with an associated service level agreement and/or data replication policy.

The storage content objects 103 that are stored in the object filers can be grouped into two categories: source objects 107 (e.g., original content) and derivative objects 109 (e.g., derived content). For example, as can be observed in FIG. 1A, a set of collaborators can create and/or upload source objects to the object filers (operation 1). Derivative object set associated with the source objects are generated using various transformation functions (operation 2). In some cases, the derivative objects are generated based on certain exhibited and/or predicted object access patterns by the collaborators (operation 3). As an example, if a user (e.g., collaborator) uploads an image to an object filer at the cloud-based content management platform, the original image and its encryption key are considered source content objects, while the thumbnails and previews of various resolutions are considered derivative content objects. One characteristic that distinguishes the source objects from the derivative objects is that the source objects cannot be regenerated by computerized means, while a derivative object is an object (e.g., file) that can be regenerated based on one or more properties of a respective source object or source object set.

As earlier mentioned, certain content objects at the object filer can become cold (e.g., infrequently accessed). In particular, the aforementioned use and purpose of the derivative objects is often such that many derivative objects become cold. Further, cold objects are often stored using the expensive storage capacity of object filers that comprise expensive hardware and consume significant space, power, and maintenance resources.

The herein disclosed techniques provide a technological solution to the foregoing problem by applying a rule base and a predictive model to the content objects to identify one or more content management actions that serve to achieve quantitative objectives (e.g., reducing storage costs, etc.). Specifically, in the embodiment shown in FIG. 1A, an instance of an object evictor applies a set of source object eviction rules to a corresponding set of source objects to identify one or more candidate source objects for eviction or removal from a corresponding object filer (operation 4). The object evictor further applies a set of derivative object eviction rules to the derivative objects to identify one or more candidate derivative objects for eviction or removal from the object filer (operation 5).

For example, the foregoing eviction rules might constrain the set of candidate eviction objects to those that can be removed from the object filer while remaining in compliance with a respective service level agreement for the objects. An objective analysis approach is then applied to the eviction candidates to determine a set of eviction actions to implement to achieve one or more quantitative objectives (e.g., reduction in aggregate costs). For example, a storage cost predictive model can be consulted to determine an eviction order for the candidate eviction objects 105 that most efficiently achieves a cost reduction objective (operation 6). A set of object management commands are then issued to the object filer to execute the eviction actions in the eviction order (operation 7). As illustrated, an eviction might comprise a true deletion of the content object and/or a move of the content object to an external storage facility (e.g., lower cost storage facility). The effects of the prescribed object eviction and/or any effects from execution of the object management commands serve to achieve the quantitative objective or objectives (e.g., to reduce storage capacity usage and costs) (operation 8).

Figure 1B:
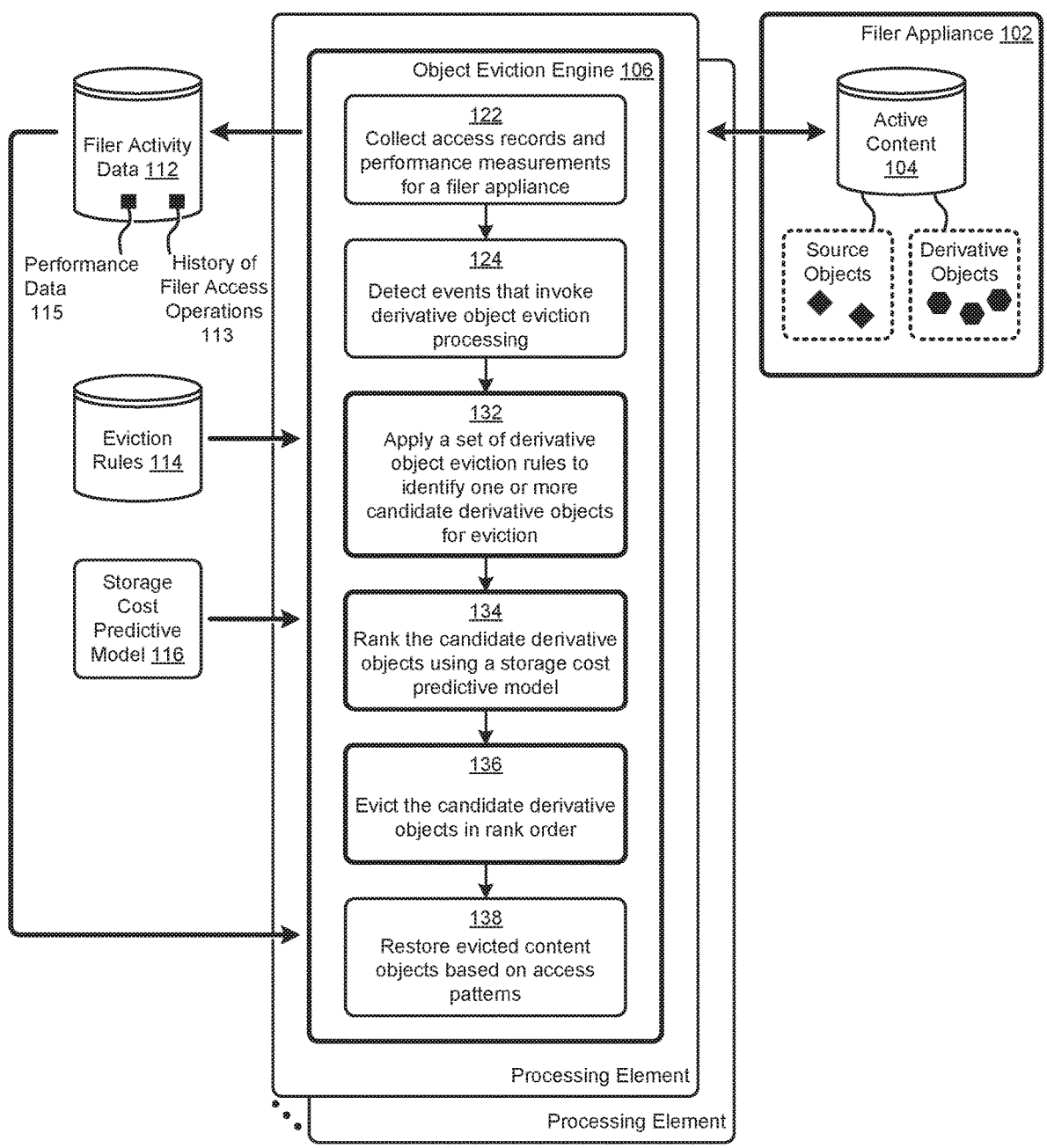
FIG. 1B depicts a content object processing technique as implemented in systems for dynamically managing cloud-based shared content using predictive modeling, according to an embodiment.

Further details describing the herein disclosed techniques for dynamic management of content objects stored on object filers are shown and described as pertaining to FIG. 1B.

FIG. 1B depicts a content object processing technique 1B00 as implemented in systems for dynamically managing cloud-based shared content using predictive modeling. As an option, one or more variations of content object processing technique 1B00 or any aspect thereof may be implemented in the context of the architecture and functionality of the embodiments described herein. The content object processing technique 1B00 or any aspect thereof may be implemented in any environment.

The content object processing technique 1B00 presents one embodiment of certain steps and/or operations for dynamically managing cloud-based shared content using predictive modeling according to the herein disclosed techniques. In one or more embodiments, the steps and underlying operations comprising content object processing technique 1B00 can be executed by an object eviction engine 106 shown as implemented in one instance of a processing element that interacts with high performance storage (e.g., one or more filer appliances comprising a given filer fleet). Certain other system components coupled to the object eviction engine 106 are also shown for reference.

Specifically, content object processing technique 1B00 can commence by collecting certain access records and performance measurements pertaining to a filer appliance (step 122). As shown, filer access operations 113 and performance data 115 can be codified and stored in a set of filer activity data 112. For example, the object eviction engine 106 might record the requests for certain instances of source objects and/or derivative objects from a set of active content 104. In some cases, such requests might be characterized as a "miss" when the requested object is not in the active content 104. Misses can be related to requests for objects removed from the active content 104 for various reasons (e.g., eviction according to the herein disclosed techniques). In some cases, the miss might be related to a request for a derivative object that has not yet been generated. Misses will often invoke the execution of commands to restore (e.g., from an external storage facility) or regenerate (e.g., from a source object) the requested content object. The filer performance measurements can comprise measurements of various filer performance metrics such as storage utilization, CPU utilization, access latency, and/or other metrics.

According to the embodiment shown in FIG. 1B, certain derivative object eviction events are detected at the object eviction engine 106 (step 124). For example, the eviction event might be invoked by a condition (e.g., eviction event condition) pertaining to a breach of a storage utilization threshold (e.g., high-water mark) at the filer appliance 102. Responsive to detecting the eviction event condition, a set of derivative object eviction rules are applied to identify one or more candidate derivative objects for eviction from the filer (step 132). For example, the derivative object eviction rules might be formed by a subset of eviction rules 114, which are in turn accessed by the object eviction engine 106 and applied to the derivative objects in the active content 104. Application of the derivative object eviction rules serve to identify a set of candidate derivative objects.

The candidate derivative objects are then ranked using a storage cost predictive model (step 134). As an example, a storage cost predictive model 116 might predict a cost savings and/or other quantitative characteristics of each of the candidate derivative objects to facilitate the ranking. The candidate derivative objects can then be evicted from the active content store (e.g., active content 104) in an execution order corresponding to the earlier determined ranking (step 136). In certain implementations, the object eviction engine 106 can further monitor the filer activity data 112 to restore certain evicted content objects (e.g., removed content objects) based on access patterns (step 138). For example, the miss history at the filer activity data 112 might invoke a restoration of a source object or a regeneration of a derivative object to the active content 104. A storage cost predictive model 116 can be populated and trained and validated using any known techniques. In one embodiment, a storage cost predictive model is configured to predict retention cost based on (1) object size, (2) measured frequency of access, and (3) predicted frequency of access. Furthermore, the storage cost predictive model can be configured to predict disposal cost based on (1) object size, (2) current frequency of access, (3) cost to regenerate and/or reload the object, and (4) historical or forecasted access patterns. Strictly as examples, a historical access pattern can be formed by including (or excluding) characteristics of access events such as (a) ownership of the object, (b) organization to which the owner belongs, (c) department to which the owner belongs, etc. Furthermore, a forecasted access pattern might be formed based on an access pattern predictive model that has been trained and validated using historical accesses. In still other situations, historical access patterns can be formed by including (or excluding) characteristics of interactions (e.g., collaboration interactions) between members of one organization and members of another organization.

Figure 1C:
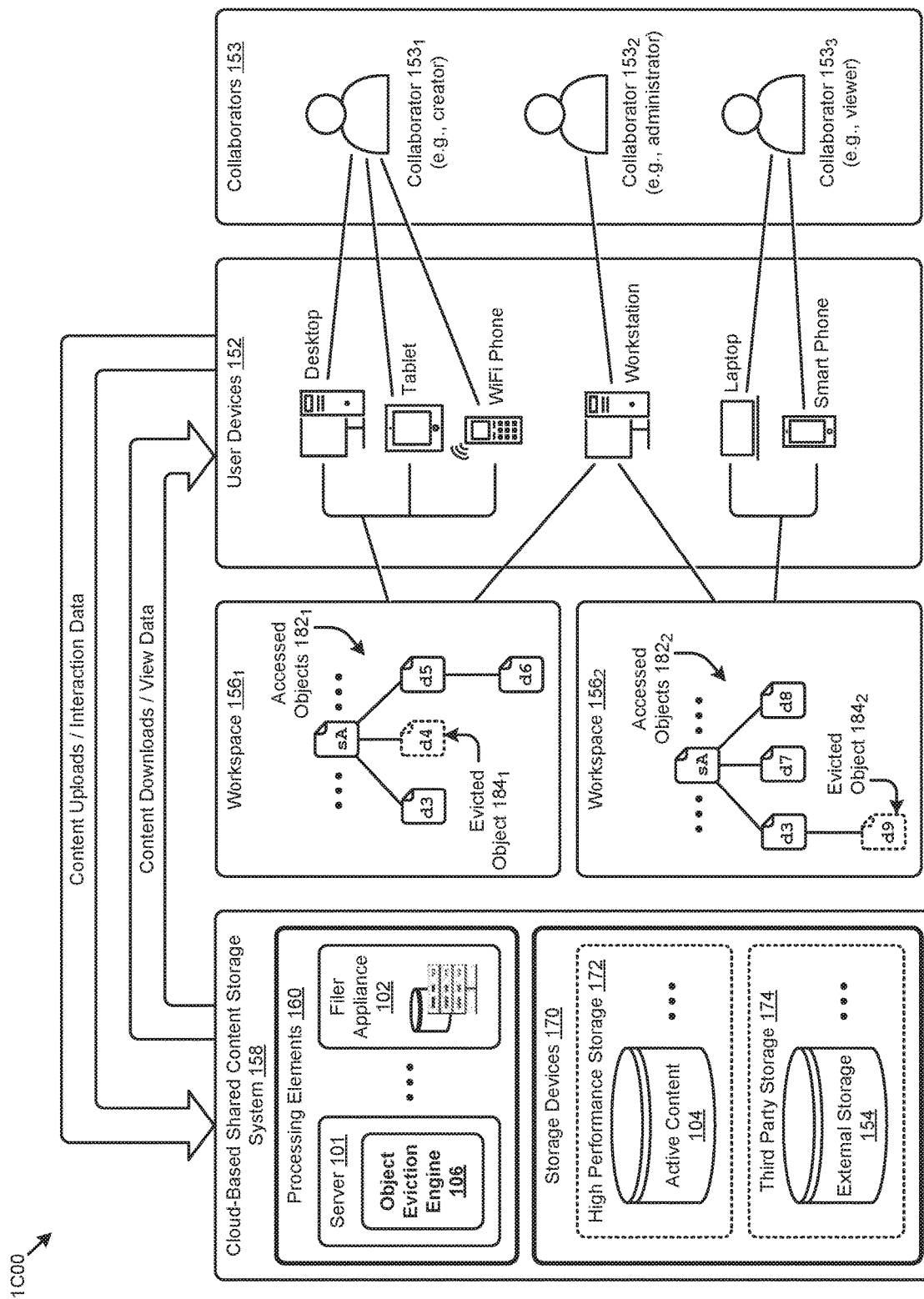
FIG. 1C depicts a cloud-based environment including a collaborative cloud-based shared content management platform that interacts with external storage facilities to facilitate dynamically managing cloud-based shared content using predictive modeling, according to some embodiments.

Further details pertaining to implementing the herein disclosed techniques in the cloud-based environment are described and shown as pertaining to FIG. 1C. Further details pertaining to implementing a storage cost predictive model in the cloud-based environment are described and shown as pertaining to FIG. 2.

FIG. 1C depicts a cloud-based shared content management system 1C00 including a collaborative cloud-based shared content management platform that interacts with external storage facilities to dynamically manage cloud-based shared content using predictive modeling. As an option, one or more variations of cloud-based shared content management system 1C00 or any aspect thereof may be implemented in the context of the architecture and functionality of the embodiments described herein. The cloud-based shared content management system 1C00 or any aspect thereof may be implemented in any environment. As used herein a cloud-based shared content management system is a collection of storage devices that are organized to share stored objects among users (e.g., people) or agents (e.g., computer programs) that access the shared stored objects over a network using a web protocol such as http.

As shown in FIG. 1C, certain users (e.g., collaborators 153) having various collaboration roles (e.g., creator, editor, administrator, approver, auditor, reviewer, etc.) can use one or more instances of user devices 152 to interact with one or more workspaces (e.g., workspace $156_1$, workspace $156_2$, etc.) facilitated by a cloud-based shared content storage system 158. As an example, collaborator $153_1$ might be a content creator (e.g., video producer) with access to workspace $156_1$, collaborator $153_3$ might be a video viewer with access to workspace $156_2$, and collaborator $153_2$ might be an administrator with access to both workspaces. The workspaces can be stored in any location, and are at least partially maintained by components within the cloud-based shared content storage system 158.

The cloud-based shared content storage system 158 supports any variety of processing elements 160 such as the filer appliance 102 and/or any number of servers (e.g., server 101) comprising the object eviction engine 106 and/or other processing elements such as a content management server, a host server, a sync server, an application server, a cloud drive server, a content server, etc. The cloud-based shared content storage system 158 further facilitates access by the foregoing processing elements to any variety of storage devices 170 such as high performance storage 172 comprising the active content 104 and/or third party storage 174 comprising external storage 154. For example, the high performance storage 172 might support data access exhibiting a lower access latency as compared to the third party storage 174, but the third party storage 174 might exhibit a lower storage cost as compared to the high performance storage 172.

Any of the users can be provisioned authorized access to various portions the content objects stored in the storage devices 170 without the need for manually downloading and storing a file locally on an instance of the user devices 152 (e.g., a desktop computer, a tablet, a WiFi phone, a workstation, a laptop computer, a smart phone, etc.). For example, one of the content objects (e.g., video file, computer file, text document, audio file, image file, etc.) created by collaborator $153_1$ might be viewed by collaborator $153_3$ without informing the other collaborators (e.g., collaborator $153_2$ collaborator $153_3$) where the file is physically stored in the storage devices 170.

User interaction with or through the aforementioned workspaces can facilitate access to certain source objects and their derivative objects by the collaborators. For example, a set of accessed objects $182_1$ at workspace $156_1$ might comprise a source object (e.g., source object sA) and various derivative objects (e.g., derivative object d3, derivative object d4, derivative object d5, and derivative object d6) associated with the source object. Further, a set of accessed objects $182_2$ at workspace $156_2$ might comprise source object sA and various derivative objects (e.g., derivative objects d3, derivative object d7, derivative object d8, and derivative object d9) associated with the source object. As can be observed, source object sA and at least one of the derivative objects (e.g., derivative object d3) are accessed at both workspaces. As further shown, some of the derivatives objects (e.g., derivative object d4 and derivative object d9) are identified as evicted (e.g., evicted object $184_1$ and evicted object $184_2$, respectively). In accordance with the herein disclosed techniques, such evicted objects might be removed from the active content 104 based on low access activity or no access activity to objects over a certain period of time (e.g., the objects are cold). In some cases, a source object or a derivative object might be "fortified" (e.g., copied to the external storage 154) before it is removed from the active content 104. For example, such fortification might be performed for objects that are expensive to regenerate (e.g., in terms of computing resources) or unfeasible to regenerate (e.g., for original objects).

In certain embodiments, the object eviction engine 106 described herein can facilitate the foregoing eviction operations and/or other operations pertaining to dynamically managing cloud-based shared content using predictive modeling. One embodiment of a system comprising the object eviction engine 106 and/or other components for implementing the herein disclosed techniques is shown and described as pertaining to FIG. 2.

Figure 2:
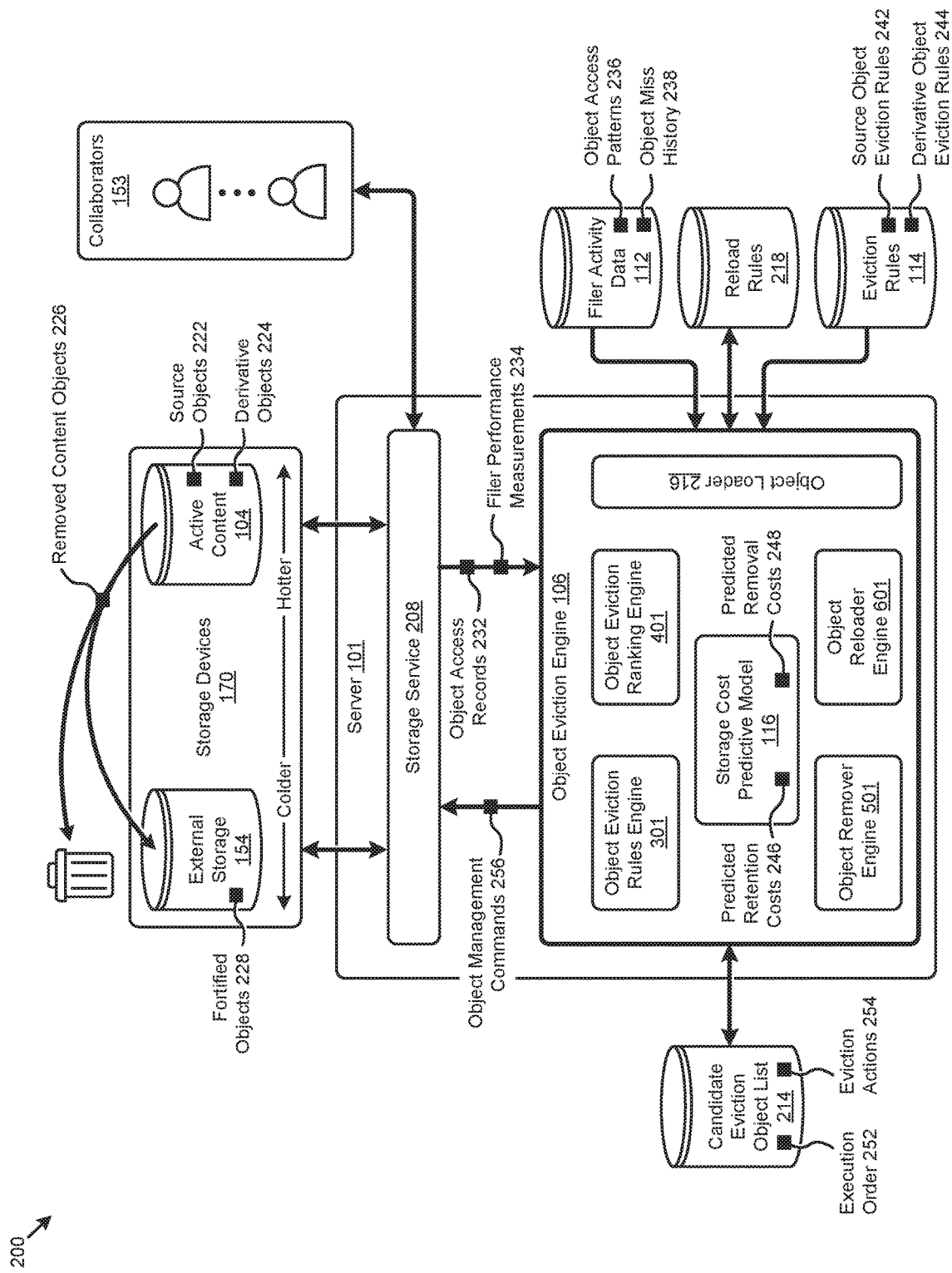
FIG. 2 presents a block diagram of a computing environment that supports various techniques as used in systems for dynamically managing cloud-based shared content using predictive modeling, according to an embodiment.

FIG. 2 presents a block diagram of a computing environment 200 that supports various techniques as used in systems for dynamically managing cloud-based shared content using predictive modeling. As an option, one or more variations of computing environment 200 or any aspect thereof may be implemented in the context of the architecture and functionality of the embodiments described herein.

The computing environment 200 shown in FIG. 2 is merely one example of components and data flows implemented in a cloud-based content management platform to support any of the herein disclosed techniques. As can be observed, computing environment 200 comprises a server (e.g., server 101) that facilitates access by collaborators 153 to a set of content (e.g., shared content) stored on storage devices 170. Representative instances of certain components and data flows associated with a representative one (e.g., server 101) of the multiple processing elements are further shown. Some of the presented components and/or data flows might have respective instances implemented at other servers or filer appliances, while some components and/or data flows might be shared by or partitioned across multiple servers and/or filer appliances.

As shown, a storage service 208 (e.g., a Scala service) within server 101 implements a data access layer (e.g., application programming interface (API)) to facilitate the aforementioned access to the content at the storage devices 170, some of which storage devices may be components within a storage appliance. Specifically, the accessed content might comprise a set of active content 104 (e.g., "hotter" content) that includes a source object set 222 and derivative object set 224. The storage service 208 further facilitates access to external storage 154. In some cases, the storage service 208 might contain functionality to generate derivative objects from the source objects.

To illustrate the herein disclosed techniques, suppose that the active content 104 in the embodiment shown is stored in a high performance storage facility (e.g., an grouping of high performance storage appliances) that stores the content objects determined to be or expected to be most frequently accessed (e.g., hot or warm content objects). Further, consider that the external storage 154 represents a set of tiered low cost storage facilities (e.g., Amazon S3, Amazon Glacier, etc.) that stores at least some of a set of removed content objects 226 determined to be or expected to be rarely accessed (e.g., colder content objects). In this scenario, the external storage 154 might store a set of fortified objects 228 from the removed content objects 226 that have been selected to be fortified at the external storage 154 and deleted from the active content 104.

To facilitate the foregoing management of the content objects across the various storage facilities available to the storage service 208 according to the herein disclosed techniques, an instance of an object eviction engine 106 is implemented within server 101. However, in other situations, an object eviction engine 106 or portions thereof might be implemented in a filer appliance. Various data stores and/or data structures are further implemented to support the herein disclosed techniques.

As shown in the embodiment of FIG. 2, a set of filer activity data 112, a set of eviction rules 114, a set of reload rules 218, and a candidate eviction object list 214 are cooperatively interconnected. Specifically, the object eviction engine 106 (e.g., implemented as a storage automation framework (SAF) task) receives a set of object access records 232 from the storage service 208 that describes various attributes (e.g., object identifier, timestamp, etc.) pertaining to object requests from the collaborators 153 and/or other entities and/or processes. The object access records 232 can be used to generate a set of object access patterns 236 stored in the filer activity data 112. The object access records 232 can further be used to generate an object miss history 238 that describes certain attributes (e.g., object identifier, timestamp, etc.) pertaining to requests for objects that had been removed from the active content 104. When a miss occurs, the requested object (e.g., a derivative object) can be regenerated by the storage service 208, or the requested object (e.g., a source object) can be retrieved from external storage 154 by the storage service 208.

In some embodiments, an object loader 216 within the object eviction engine 106 monitors the object access records 232 to build the object miss history 238. A set of filer performance measurements 234 that describe measurements of various filer appliance performance metrics and/or storage device performance metrics at a given moment in time can further be received at the object eviction engine 106. Such filer appliance performance metrics might pertain to storage utilization, CPU utilization, access latency, and/or other performance characteristics of the filer appliance. As an example, certain performance measurements (e.g., filer appliance utilization, storage device utilization) and/or combinations of measurements might characterize one or more eviction event conditions that invoke (or suspend or halt) a set of corresponding operations at the object eviction engine 106. As used herein a storage device is any device capable of holding data using tangible media. Examples are hard disk drives, solid state storage devices, battery-backed RAM, etc.

Some such operations invoked at the object eviction engine 106 might involve an interaction with the candidate eviction object list 214. Specifically, the object eviction engine 106 might invoke certain processes to generate a list of eviction candidates from the active content 104. In some cases, generating the candidate eviction object list 214 can be performed by a background and/or offline process that scans (e.g., weekly) the access logs for the active content 104 to build a list of objects that might be candidates for eviction. In some cases, historical access logs are not available. In such cases, monotonically increasing object identifiers for the content objects might be used as an indication of the time of creation (e.g., "age") of the objects.

The shown partitioning of object eviction engine 106 comprises an object eviction rules engine 301, an object eviction ranking engine 401, an object remover engine 501, and an object reloader engine 601. Further, the shown partitioning of object eviction engine 106 includes an instance of a storage cost predictive model 116, which is accessible by any and all of the foregoing processing engines.

Various operations performed by the foregoing engines, or otherwise invoked at the object eviction engine 106, might in turn invoke an application of a set of eviction rules 114 (e.g., source object eviction rules 242 and derivative object eviction rules 244) to the candidate eviction object list 214 to determine a set of eviction actions 254 for the eviction candidates. In certain embodiments, the eviction actions 254 comprise a respective set of object management commands 256 that are issued to the storage service 208 to carry out the eviction action for a particular content object. In some cases, a storage cost predictive model 116 is consulted (e.g., by the object eviction ranking engine 401) to determine an execution order 252 for the candidate eviction object list 214. For example, the storage cost predictive model 116 might produce a set of predicted retention costs 246 that pertain to retaining the candidate eviction objects in a filer appliance, and a set of predicted removal costs 248 that pertain to removing the candidate eviction objects from the filer appliance.

The foregoing predicted costs can be used to assign a cost reduction score to the candidate eviction objects 105, which score is used to determine the execution order 252. When certain eviction event conditions are detected at the object eviction engine 106, the respective object management commands of some or all of the objects on the candidate eviction object list 214 are executed in the execution order 252. In some cases, certain instances of the removed content objects 226 are restored (e.g., reloaded, regenerated, etc.) to the active content 104 based on the filer activity data 112. As an example, a particular object might be restored when the object miss history 238 indicates the object has transitioned from a cold state to a warm state. Specifically, the object reloader engine 601 can apply the reload rules 218 to the object miss history 238 to determine the object management commands to issue to the storage service 208 so as to restore certain content objects.

The computing environment 200 shown in FIG. 2 presents merely one partitioning. The specific example shown is purely exemplary, and other subsystems and/or partitioning is reasonable.

Figure 3:
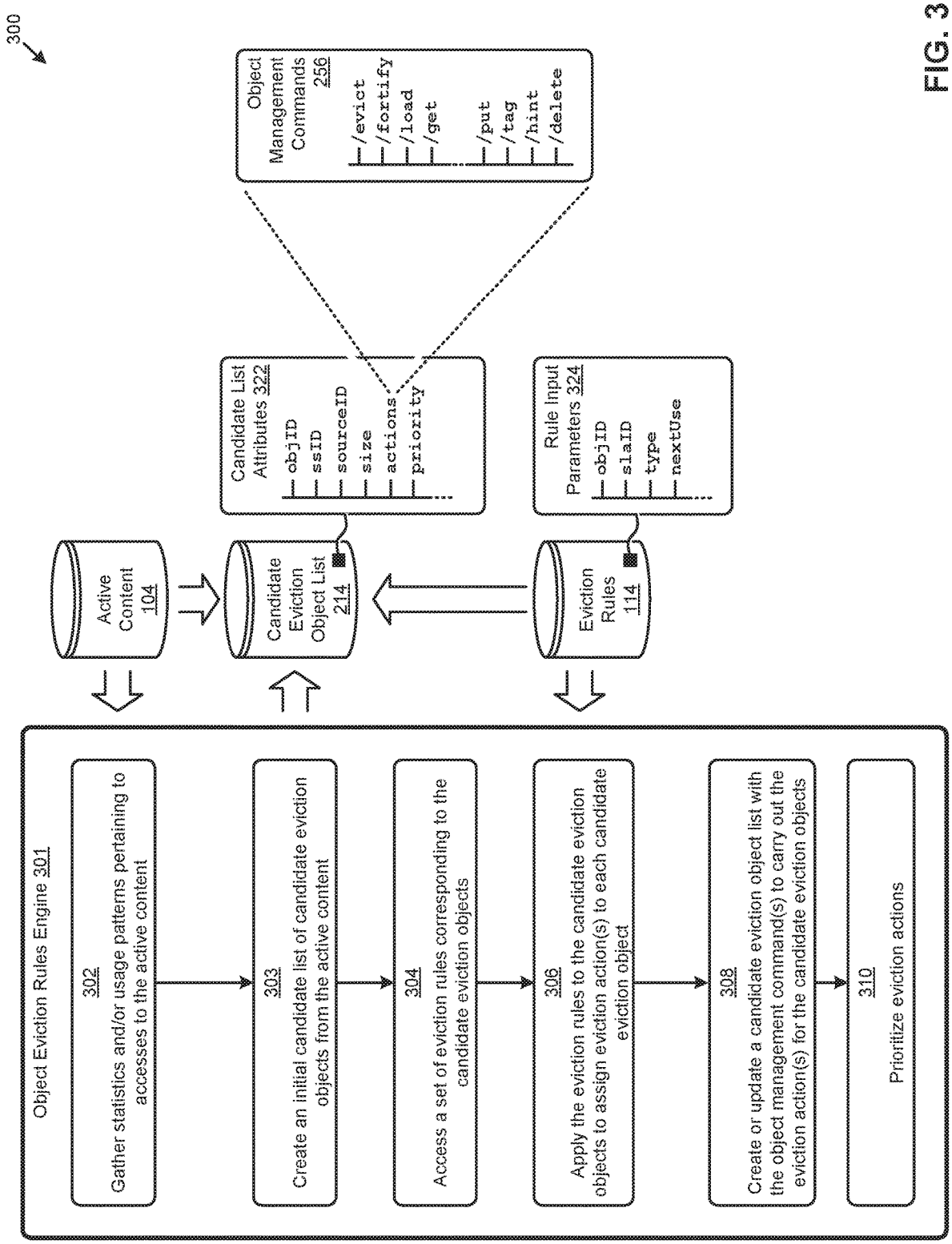
FIG. 3 illustrates a candidate eviction object selection technique as implemented in systems for dynamically managing cloud-based shared content using predictive modeling, according to an embodiment.

FIG. 3 illustrates a candidate eviction object selection technique 300 as implemented in systems for dynamically managing cloud-based shared content using predictive modeling. As an option, one or more variations of candidate eviction object selection technique 300 or any aspect thereof may be implemented in the context of the architecture and functionality of the embodiments described herein. The candidate eviction object selection technique 300 or any aspect thereof may be implemented in any environment.

FIG. 3 depicts one embodiment of various steps and/or operations implemented within an object eviction rules engine 301. The operations serve to select eviction object candidates. The eviction rules are codified in specialized data structures that are designed to improve the way a computer stores and retrieves data in memory when performing such steps and/or operations. As illustrated, the shown steps and/or operations can be performed by an instance or component of an object eviction engine (e.g., object eviction engine 106) as described herein.

The candidate eviction object selection technique 300 can commence at step 302 by gathering statistics and/or usage patterns pertaining to accesses to the active content. Then, based on the gathered information, creating an initial candidate list of candidate eviction objects from the active content of a given filer appliance (step 303). As an example, snapshots (e.g., weekly Hive-hosted snapshots) of the file and version information associated with the active content 104 might be combined with corresponding access logs (e.g., download logs from a download proxy) to produce the candidate eviction object list 214. As shown, the candidate eviction object list 214 might comprise various attributes (e.g., candidate list attributes 322) that describe the candidate eviction objects on the list. The data comprising the candidate eviction object list 214 are often organized and/or stored in a tabular structure (e.g., Hadoop HBase table) having rows corresponding to a particular candidate object and columns corresponding to various attributes pertaining to that candidate object. For example, as depicted in the candidate list attributes 322, a table row might describe an object identifier or "objID", a storage service identifier or "ssID" (e.g., used to identify an associated filer appliance), a source object identifier or "source ID" associated with the candidate object (e.g., source ID=null for source objects), an object "size" (e.g., in MB), a list of "actions", an execution order position or "priority", a candidate list schema version, and/or other attributes. In some embodiments, the key to each item (e.g., row) in the candidate eviction object list 214 comprises a combination of a hashed version of the "ssID", the "priority" attribute, and the "objID" attribute. The hashed "ssID" and the "priority" can have fixed widths to facilitate priority-ordered list scan operations on a per-"ssID" basis.

The candidate eviction object selection technique 300 further involves interaction (e.g., by the object eviction engine 106) with various eviction rules (e.g., eviction rules 114) corresponding the candidate eviction objects (step 304). The eviction rules 114 are applied (e.g., object-by-object) to the candidate eviction object list 214 to assign one or more eviction actions to each candidate eviction object (step 306). A rule base such as eviction rules 114 comprises data records storing various information that can be used to form one or more constraints to apply to certain functions and/or operations. For example, an eviction rule might specify a set of object attributes that, if matched by the attributes describing a certain candidate object, select a corresponding set of eviction actions to assign to that particular candidate object. For example, a derivative object that is characterized as non-deterministic (e.g., multiple derivative generation executions may produce varying results) might be assigned an eviction action that comprises a fortify operation followed by an evict operation, while a derivative object that is characterized as deterministic (e.g., multiple derivative generation executions produce the same result) might be assigned an eviction action that comprises merely an evict operation. In some cases, the information pertaining to an eviction rule might comprise various input parameters that are consumed by corresponding conditional logic statements that are executed to determine one or more results (e.g., eviction actions).

For example, data storage location constraints pertaining to a service level agreement associated with a given content object might be applied to a selected conditional logic statement (e.g., if-then statement, case statement, etc.) to determine whether the content object is to be retained in active storage, fortified and evicted, or merely evicted. In such cases, the eviction rules 114 might be organized and/or stored as programming code objects that receive object-specific input parameters such as rule input parameters 324, that are used to determine certain results (e.g., eviction actions) corresponding to each candidate eviction object. The data comprising the rule input parameters 324 are often organized and/or stored in a tabular structure (e.g., relational database table) having rows corresponding to a particular candidate object and columns corresponding to various rule input parameters pertaining to that candidate object. For example, as depicted in the rule input parameters 324, a table row might describe an object identifier or "objID", a service level agreement (SLA) identifier or "slaID", a candidate object "type" (e.g., deterministic, non-deterministic, original, etc.), an expected time of next use for the object or "nextUse", and/or other parameters.

Other possible examples of eviction actions determined by applying the eviction rules 114 to the candidate eviction object list 214 follow. In one example, some original content (e.g., source content objects) might be fortified prior to being evicted so as to maintain a two-replica SLA constraint. In another example, for derivative objects (e.g., image thumbnail) having a one-to-one relationship with a source object (e.g., an image), the derivative object can merely be evicted since the derivative object can be regenerated if requested at a later moment in time. As yet another example, for derivative objects (e.g., document preview) having a one-to-many relationship with multiple assets (e.g., the pages of the preview), the assets associated with the derivative object are identified and assigned a selected eviction action (e.g., all pages in the preview are evicted).

In still other situations, some derivative objects might also exhibit a time of expected reuse or next use as indicated by the "nextUse" attribute. For example, medical records might be accessed near the time of an upcoming appointment, or tax records might be accessed more frequently during tax season. Such expected reuse time might factor into decisions pertaining to eviction actions. As an option, the "nextUse" indicator might be used to establish a set of time-based eviction actions that facilitate a deletion of an object for a certain period of time (e.g., to avoid storage costs) and regeneration of the object prior to its expected use.

When the eviction rules 114 are applied to the candidate eviction object list 214 and the eviction actions for the candidate objects in the list are determined, the candidate eviction object list 214 is updated with the object management commands to carry out the determined eviction actions (step 308). Specifically, for example, the "action" attribute of a particular candidate object is updated to describe the commands from the object management commands 256 selected to carry out the eviction action or actions for the candidate object. More specifically, in certain embodiments, the "/evict" service call from the object management commands 256 requests that the storage service evict the subject object (e.g., designated by the "objID") from the active content 104.

In some cases, the storage service might override the "/evict" command. For example, the then-current data retention policy (e.g., from the SLA) might forbid any type of eviction of the object. As another example, there is an insufficient number of replicas (e.g., according to a data replication policy) to evict the object. In this case, the "/fortify" command might be included in the eviction "actions" and executed prior to executing an "/evict" command. In certain embodiments, the "/fortify" call instructs the storage service to invoke an asynchronous job to perform the data transmission (e.g., object copy) required to achieve fortification. If the optional "&evict=true" service call parameter is provided, an "/evict" call is automatically triggered upon successful completion of the "/fortify" operation. The "/load" call is issued, for example, by an object loader to restore a subject object to the active content 104. Further details pertaining to restoring removed content objects is shown and described as pertaining to FIG. 6.

In some situations, still further variations of object management commands 256 are provided. Such additional object management commands might include a "/get" command (e.g., for requesting a subject object), a "/put" command (e.g., to put a source object to a shared storage device), a "/tag" command (e.g., to add tagging metadata to a corresponding object), a "/hint" command (e.g., to add classification or other information to metadata corresponding intended restrictions or behaviors over the object), and a "/delete" command (e.g., to delete a subject object from a shared storage device).

Strictly as examples, a "/tag" might refer to formally specified data features or characteristics such as, "PERMANENT" (e.g., to suggest that no eviction should take place on the file), or "TEMPORARY" (e.g., used to explicitly identify short-lived files that can be quickly deleted or moved to lower-cost storage). Other tags are possible. Tags can be used to explicitly override default behaviors.

The execution of a "/hint" command might add still additional information that might influence behavior. For example, metadata provided by a "/hint" command might inform the system if an uploaded object is to be regarded as an intermediate object or as a final product object, or it may provide an indication that an object is a highly connected object (e.g., in association with other objects in a provenance relationship). In some cases a "/hint" (or other command) may indicate that derivative objects are to be regenerated immediately upon a change to a respective source object.

Performing such management commands on objects can influence aspects of future management commands. A series of management commands can be strung together or otherwise associated to form patterns. Strictly as one example, if a recurring pattern of /load followed by /evict, followed by /load is detected, that pattern might be indicative of an object where the predicted retention cost is equal or nearly equal to the predicted removal cost. Such a scenario might result in thrashing. Accordingly, detection of the recurring pattern might cause a bias value or hysteresis value to be stored in metadata pertaining to the thrashing object, so as to avoid continued thrashing.

At step 310, once a candidate list and associated items have been determined (e.g., according to the candidate eviction object selection technique 300), various techniques can be used to determine the "priority" or execution order of the eviction candidates. One such prioritization or ranking technique is shown and described as pertaining to FIG. 4.

Figure 4:
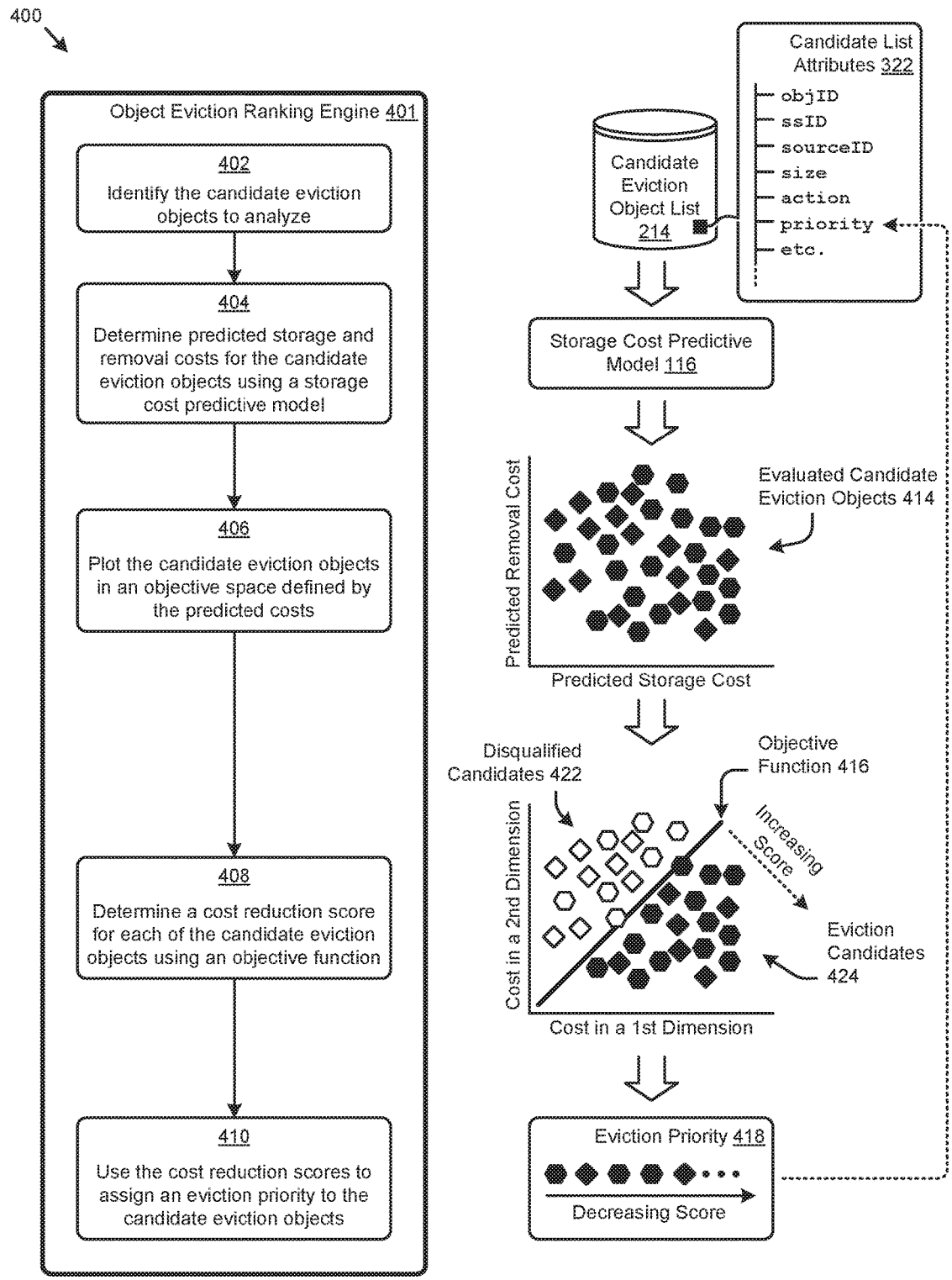
FIG. 4 presents a candidate eviction object ranking technique as implemented in systems for dynamically managing cloud-based shared content using predictive modeling, according to an embodiment.

FIG. 4 presents a candidate eviction object ranking technique 400 as implemented in systems for dynamically managing cloud-based shared content using predictive modeling. As an option, one or more variations of candidate eviction object ranking technique 400 or any aspect thereof may be implemented in the context of the architecture and functionality of the embodiments described herein. The candidate eviction object ranking technique 400 or any aspect thereof may be implemented in any environment.

The candidate eviction object ranking technique 400 presents one embodiment of an object eviction ranking engine 401 that implements certain steps and/or operations for ranking and/or prioritizing for eviction one or more candidate eviction objects according to the herein disclosed techniques. In one or more embodiments, the steps and underlying operations comprising candidate eviction object ranking technique 400 can be executed by an object eviction ranking engine 401, or by any variations of the object eviction engine 106 described herein.

The shown candidate eviction object ranking technique 400 can commence by identifying the candidate eviction objects to analyze (step 402). For example, the identified candidate eviction objects might comprise the candidate eviction object list 214. In certain embodiments, analysis of candidate eviction objects comprises use of a storage cost predictive model (e.g., storage cost predictive model 116) to determine predicted retention costs and predicted removal costs for the candidate eviction objects (step 404). Learning models such as the storage cost predictive model 116 are a collection of mathematical techniques (e.g., algorithms) that facilitate determining (e.g., predicting) a set of outputs (e.g., outcomes, responses) based on a set of inputs (e.g., stimuli). A storage cost predictive model can include data that includes an indicator corresponding to whether the stimuli pertains to a source object, or the stimuli pertains to a derivative object. Moreover, given an indication corresponding to whether the stimuli pertains to a source object, or the stimuli pertains to a derivative object, a source object can be subjected to an analysis using a first set of criteria (e.g., costs pertaining to the source object), and a derivative object can be subjected to an analysis using a second set of criteria (e.g., costs pertaining to the derivative object).

For example, a storage cost predictive model 116 might consume a set of object attributes (e.g., source object indication, derivative object indication, size, number of related objects, predicted access patterns, etc.) as inputs to predict a set of storage costs and removal costs as outputs. For example, such costs might pertain to ongoing storage facility costs, but also pertain to computing costs and networking costs for restoring (e.g., retrieving, regenerating, uploading, etc.) removed content objects, quantitative "cost" representations of the user experience (e.g., related to request delays, etc.), and/or other costs. In some cases, the techniques implemented by the model might comprise a set of equations having coefficients that relate one or more of the input variables to one or more of the output variables. In these cases, the equations and coefficients can be determined by a training process.

To facilitate comparison of the candidate eviction objects, the objects are plotted in an objective space defined by a set of quantitative objectives such as the foregoing predicted cost metrics (step 406). For example, a set of evaluated candidate eviction objects 414 can be plotted in a two-dimensional objective space defined by a predicted retention cost objective and a predicted removal cost objective. Any number of other objectives is possible. An objective function relating the objectives (e.g., predicted retention cost and predicted removal cost) in the objective space can be used to determine cost reduction scores for the plotted candidate eviction objects (step 408).

As an example, the objective function comprising quantitative objectives 416 might have characteristics that identify the points in the objective space. Other characteristics (e.g., slopes, polynomial orders, etc.) pertaining to the objective function can define different objective spaces. In some cases, and as shown, the plotted candidate eviction objects to the right of and below the objective function comprising quantitative objectives 416 are identified as eviction candidates 424 (e.g., the predicted cost in a first dimension is less than or equal to the predicted cost in a second dimension) while the remaining plotted candidate content objects are identified as disqualified candidates 422 (e.g., the predicted cost in the first dimension is greater than the predicted cost in the second dimension).

In the specific case shown, the plotted candidate eviction objects to the right of and below the objective function comprising quantitative objectives 416 are identified as eviction candidates 424 since the predicted cost in the first dimension (e.g., predicted removal cost) is less than or equal to the predicted cost in the second dimension (e.g., the predicted retention cost). The scores can be used with or without other information (e.g., a bias value and/or a hysteresis value) to assign an eviction priority 418 to the candidate eviction objects (step 410).

An objective function can be formed using any number of terms (e.g., variables and/or constants). As an example, one objective function might consider the (lowered) cost of fortifying an object to external storage, at the same time that the cost of access/retrieval from the external storage is considered. As a specific case, although it might be 50% less expensive to fortify an object to cold storage than it would be to retain the object in a filer, it might be twice as costly (e.g., due to access fees charged by external storage vendor) to retrieve it from the cold storage. As such the objective function might include likelihood of future access in the objective function calculation.

As illustrated, some representation (e.g., numbered sequence) of the eviction priority 418 can be stored in the "priority" attribute from the candidate list attributes 322 describing the candidate eviction object list 214. In this case, the "priority" attribute of the disqualified candidates 422 might remain "null" to distinguish the disqualified candidates 422 from the eviction candidates 424 prioritized for execution. The eviction priority 418 can be used to determine an eviction execution order invoked by certain eviction event conditions as shown and described as pertaining to FIG. 5.

Figure 5:
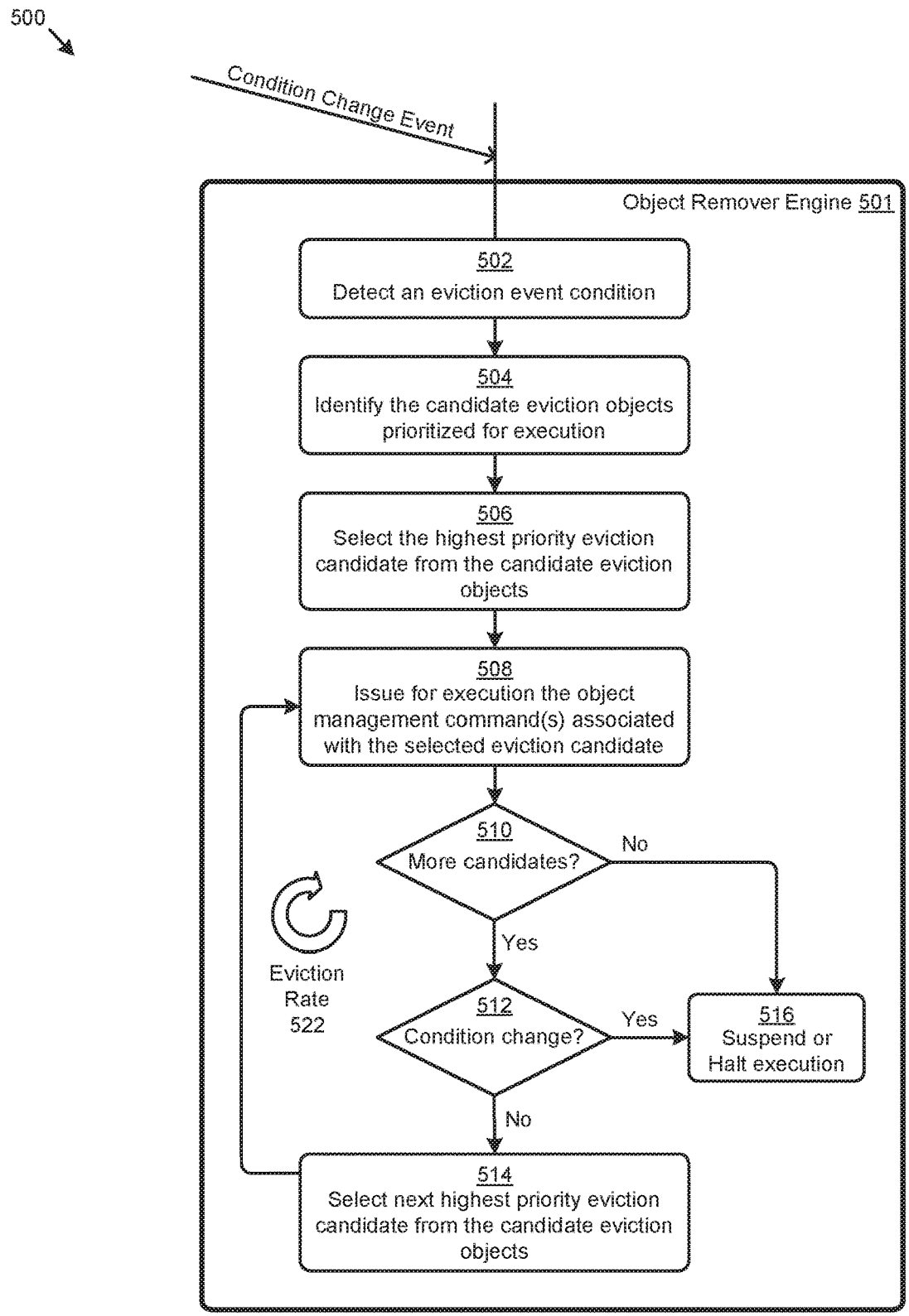
FIG. 5 depicts a content object removal technique as implemented in systems for dynamically managing cloud-based shared content using predictive modeling, according to an embodiment.

FIG. 5 depicts a content object removal technique 500 as implemented in systems for dynamically managing cloud-based shared content using predictive modeling. As an option, one or more variations of content object removal technique 500 or any aspect thereof may be implemented in the context of the architecture and functionality of the embodiments described herein. The content object removal technique 500 or any aspect thereof may be implemented in any environment.

The content object removal technique 500 presents one embodiment of certain steps and/or operations for removing (e.g., evicting) one or more candidate eviction objects according to the herein disclosed techniques. In one or more embodiments, the steps and underlying operations comprising content object removal technique 500 can be executed by the shown object remover engine 501, or by an instance or component of an object eviction engine 106 described herein.

The content object removal technique 500 can commence by detecting one or more eviction event conditions (step 502). For example, the object eviction engine 106 might monitor the storage capacity used at a given filer appliance. When the object eviction engine 106 detects the capacity utilization has breached some threshold (e.g., high-water mark), the object eviction engine 106 can invoke various eviction processes. In some embodiments, the thresholds can be specific for a given filer appliance to manage the eviction activities and/or policies on a per-filer basis. Certain of the aforementioned detected eviction event conditions might invoke the identification of any candidate eviction objects having actions that are prioritized for execution (step 504). From these candidate eviction objects the highest priority eviction candidate can be selected (step 506).

The object management command or commands associated with the selected eviction candidate are then issued (e.g., to the storage service) to carry out the earlier determined eviction actions for the selected object (step 508). If more eviction candidates are available (see "Yes" path of decision 510) and the eviction event conditions (e.g., breached filer utilization threshold) remain (see "No" path of decision 512) such that the execution of the invoked eviction process should continue, then the next highest priority eviction candidate is selected (step 514). The object management command or commands associated with the selected eviction candidate are issued (step 508) and the process continues until either (1) no eviction candidates remain (see "No" path of decision 510) or until (2) the eviction event conditions change (see "Yes" path of decision 512) such that the execution of the invoked eviction process should be suspended or halted (step 516). As one specific example, of suspension, if (e.g., as a result of a series of evictions) the filer utilization threshold drops below a particular utilization threshold, then the object remover engine might suspend itself until conditions change, causing another iteration within the object remover engine (e.g., iterating from an event detection at step 502).

In some cases, the rate (e.g., eviction rate 522) at which the eviction actions of the selected eviction candidates are executed is regulated. The eviction rate 522 (e.g., evictions per second) can be defined on a per-filer basis to govern the load on the filer appliance and/or the associated networking and storage resources related to the eviction operations. In other cases, one or more of the removed content objects resulting from any of the foregoing eviction operations are restored. One embodiment of a technique for restoring removed content objects is shown and described as pertaining to FIG. 6.

Figure 6:
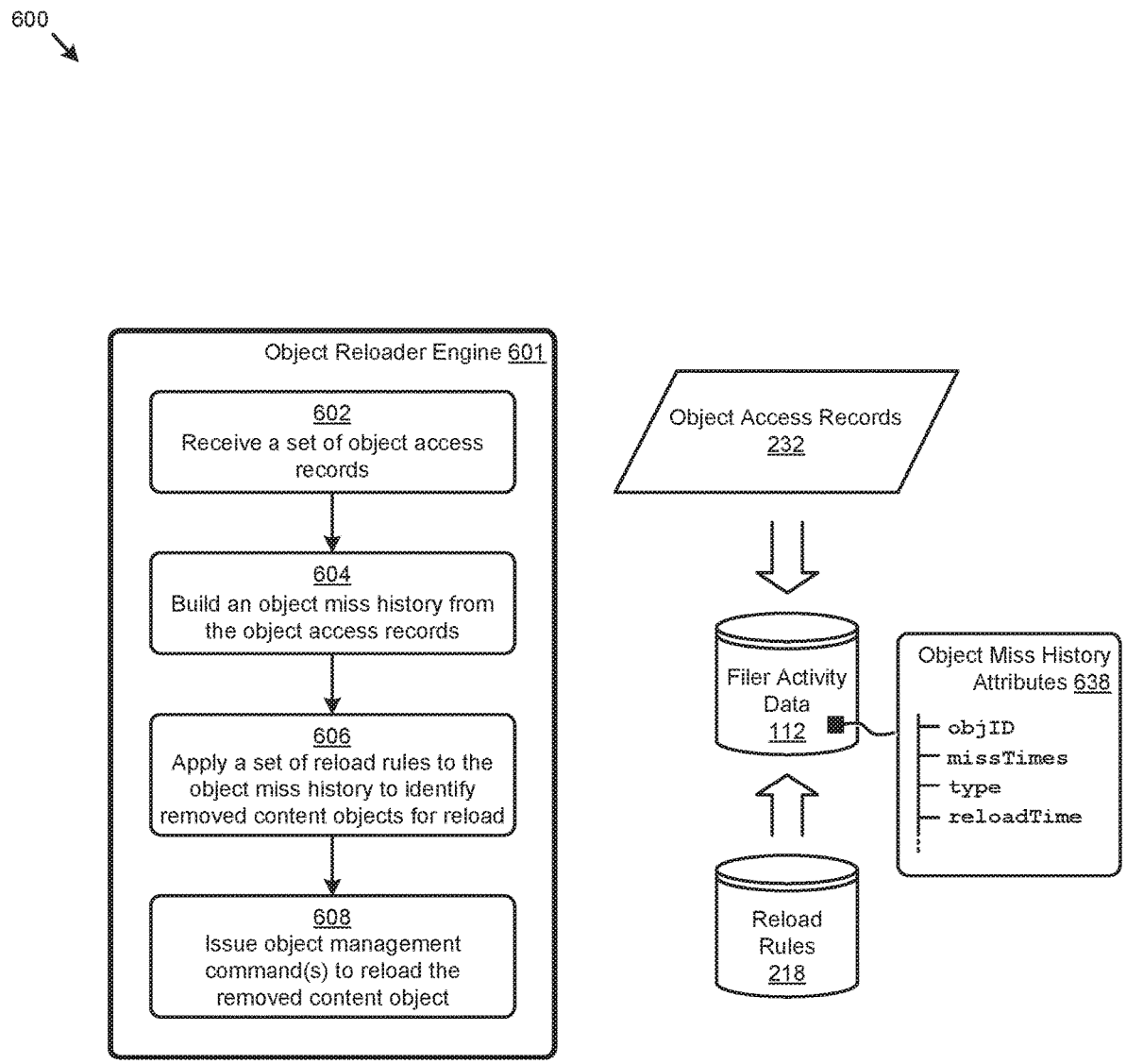
FIG. 6 depicts a content object restoration technique as implemented in systems for dynamically managing cloud-based shared content using predictive modeling, according to an embodiment.

FIG. 6 depicts a content object restoration technique 600 as implemented in systems for dynamically managing cloud-based shared content using predictive modeling. As an option, one or more variations of content object restoration technique 600 or any aspect thereof may be implemented in the context of the architecture and functionality of the embodiments described herein. The content object restoration technique 600 or any aspect thereof may be implemented in any environment.

FIG. 6 depicts one embodiment of various steps and/or operations to restore removed content objects previously evicted from active content according to the herein disclosed techniques. As illustrated, the shown steps and/or operations can be performed by an instance of an object reloader engine 601, or by any operations or components of the object eviction engine 106 described herein.

The content object restoration technique 600 can commence by receiving a set of object access records (step 602) that can be used to build an object miss history (step 604). For example, the object access records 232 can be used to store or generate an object miss history. Implementations or codifications of an object miss history might comprise various attributes (e.g., object miss history attributes 638) that describe the content object request misses. The data comprising the object miss history are often organized and/or stored in a tabular structure (e.g., Hadoop HBase table) having rows corresponding to a particular missed object and columns corresponding to various attributes pertaining to that missed object. For example, as depicted in the object miss history attributes 638, a table row might describe an object identifier or "objID", a list of timestamps pertaining to misses for the object or "missTimes", a description of the type of miss or "type" (e.g., due to eviction, due to unavailability of filer, due to object in the process of being restored, etc.), a timestamp pertaining to the last reload of the object or "reloadTime", and/or other attributes.

A set of reload rules (e.g., reload rules 218) are applied to the object miss history 238 to identify removed content objects for reload (step 606). As an example, the reload rules might indicate that any removed content object for which N misses have occurred over a time period T (e.g., as determined from the object miss history 238) is to be reloaded. In this case, the variables N and/or T are tunable on a filer-by-filer basis and/or on an ownership basis, and/or on an SLA basis, and/or on an object-by-object basis. In some cases, the then-current predicted costs (e.g., from a storage cost predictive model) for restoring the subject removed content object can also be used to determine whether to restore the subject object. When a determination has been made to restore a removed content object, the object management commands to reload the subject object are issued (step 608). For example, a "/load" command for the subject object might be issued by the object loader 216 (see FIG. 2) to a storage service at the filer appliance. In some cases, the "/load" command might invoke a move and/or a copy of the subject object (e.g., source object) from external storage to active content. In other cases, the "/load" command might invoke a regeneration of the subject object (e.g., derivative object) by the storage service.

Additional Embodiments of the Disclosure

Additional Practical Application Examples

Figure 7:
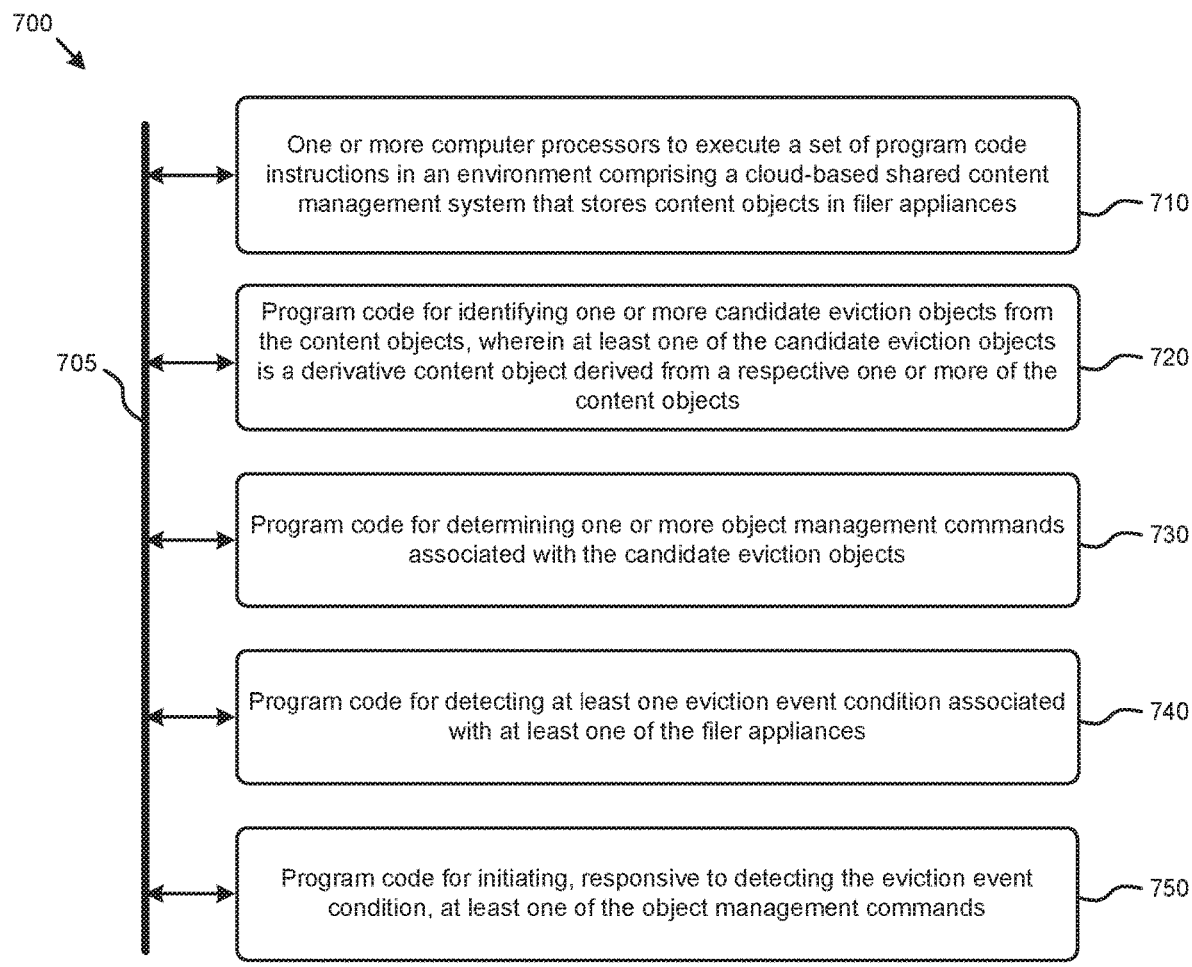
FIG. 7 depicts system components as arrangements of computing modules that are interconnected so as to implement certain of the herein-disclosed embodiments.

FIG. 7 depicts a system 700 as an arrangement of computing modules that are interconnected so as to operate cooperatively to implement certain of the herein-disclosed embodiments. This and other embodiments present particular arrangements of elements that, individually and/or as combined, serve to form improved technological processes that address minimizing highly-available storage requirements in the presence of a highly dynamic corpus of shared content objects in a cloud-based content management environment. As an option, the system 700 may be implemented in the context of the architecture and functionality of the embodiments described herein. Of course, however, the system 700 or any operation therein may be carried out in any desired environment. The system 700 comprises at least one processor and at least one memory, the memory serving to store program instructions corresponding to the operations of the system. As shown, an operation can be implemented in whole or in part using program instructions accessible by a module. The modules are connected to a communication path 705, and any operation can communicate with other operations over communication path 705. The modules of the system can, individually or in combination, perform method operations within system 700. Any operations performed within system 700 may be performed in any order unless as may be specified in the claims. The shown embodiment implements a portion of a computer system, presented as system 700, comprising a computer processor to execute a set of program code instructions (module 710) and modules for accessing memory to hold program code instructions to perform: identifying one or more candidate eviction objects from the content objects, where at least one of the candidate eviction objects is a derivative content object derived from a respective one or more of the content objects (module 720); determining one or more object management commands associated with the candidate eviction objects (module 730); detecting at least one eviction event condition associated with at least one of the filer appliances (module 740); and initiating, responsive to detecting the eviction event condition, at least one of the object management commands (module 750).

Figure 8A:
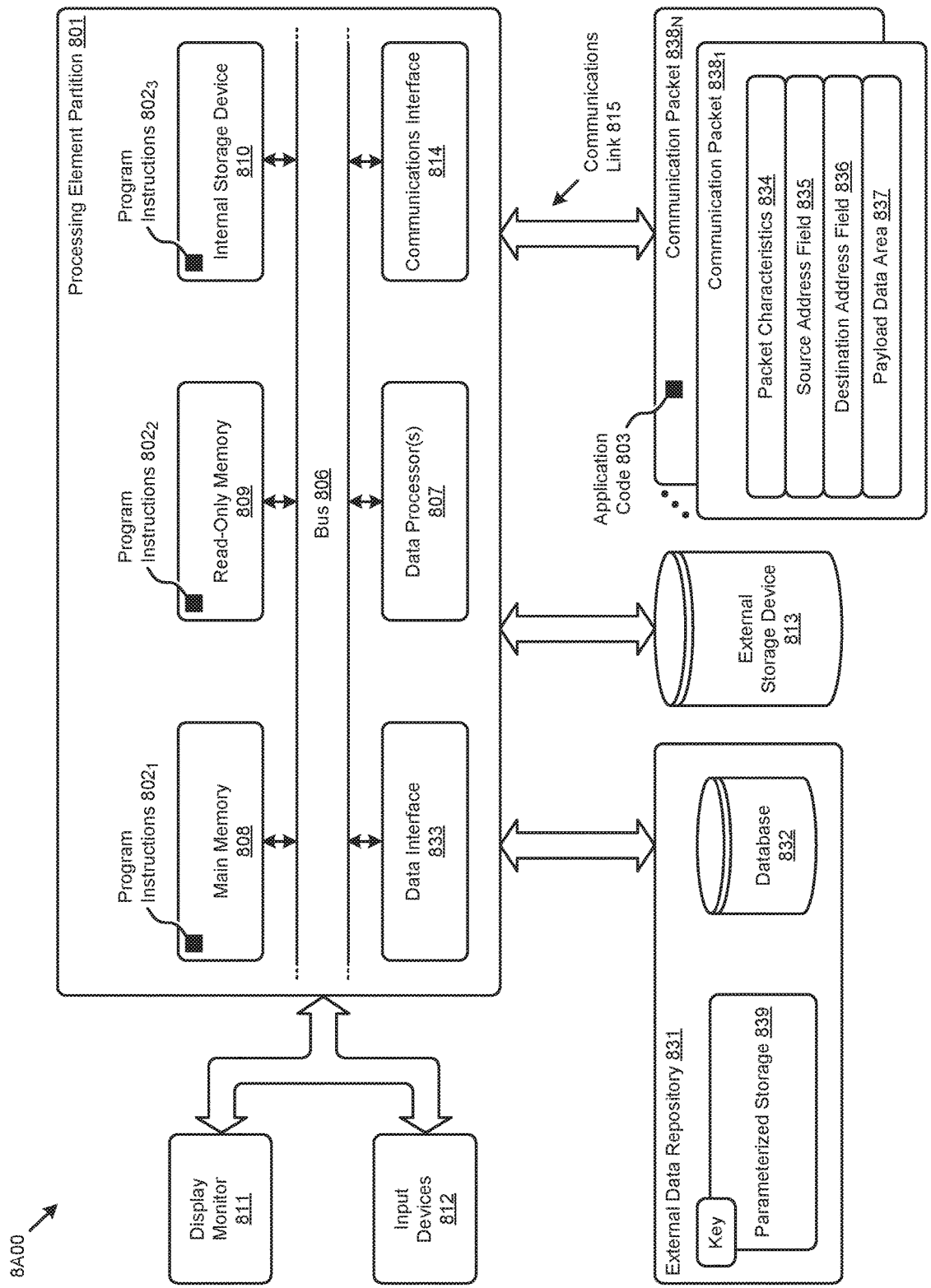
FIG. 8A and FIG. 8B present block diagrams of computer system architectures having components suitable for implementing embodiments of the present disclosure, and/or for use in the herein-described environments.

Variations of the foregoing may include more or fewer of the shown modules. Certain variations may perform more or fewer (or different) steps, and/or certain variations may use data elements in more, or in fewer (or different) operations.
System Architecture Overview
Additional System Architecture Examples FIG. 8A depicts a block diagram of an instance of a computer system 8A00 suitable for implementing embodiments of the present disclosure. Computer system 8A00 includes a bus 806 or other communication mechanism for communicating information. The bus interconnects subsystems and devices such as a central processing unit (CPU), or a multi-core CPU (e.g., data processor 807), a system memory (e.g., main memory 808, or an area of random access memory (RAM)), a non-volatile storage device or non-volatile storage area (e.g., read-only memory 809), an internal storage device 810 or external storage device 813 (e.g., magnetic or optical), a data interface 833, a communications interface 814 (e.g., PHY, MAC, Ethernet interface, modem, etc.). The aforementioned components are shown within processing element partition 801, however other partitions are possible. The shown computer system 8A00 further comprises a display 811 (e.g., CRT or LCD), various input devices 812 (e.g., keyboard, cursor control), and an external data repository 831.

According to an embodiment of the disclosure, computer system 8A00 performs specific operations by data processor 807 executing one or more sequences of one or more program code instructions contained in a memory. Such instructions (e.g., program instructions $802_1$, program instructions $802_2$, program instructions $802_3$, etc.) can be contained in or can be read into a storage location or memory from any computer readable/usable storage medium such as a static storage device or a disk drive. The sequences can be organized to be accessed by one or more processing entities configured to execute a single process or configured to execute multiple concurrent processes to perform work. A processing entity can be hardware-based (e.g., involving one or more cores) or software-based, and/or can be formed using a combination of hardware and software that implements logic, and/or can carry out computations and/or processing steps using one or more processes and/or one or more tasks and/or one or more threads or any combination thereof.

According to an embodiment of the disclosure, computer system 8A00 performs specific networking operations using one or more instances of communications interface 814. Instances of the communications interface 814 may comprise one or more networking ports that are configurable (e.g., pertaining to speed, protocol, physical layer characteristics, media access characteristics, etc.) and any particular instance of the communications interface 814 or port thereto can be configured differently from any other particular instance. Portions of a communication protocol can be carried out in whole or in part by any instance of the communications interface 814, and data (e.g., packets, data structures, bit fields, etc.) can be positioned in storage locations within communications interface 814, or within system memory, and such data can be accessed (e.g., using random access addressing, or using direct memory access DMA, etc.) by devices such as data processor 807.

The communications link 815 can be configured to transmit (e.g., send, receive, signal, etc.) any types of communication packets (e.g., communication packet $838_1, \ldots,$ communication packet $838_N$) comprising any organization of data items. The data items can comprise a payload data area 837, a destination address 836 (e.g., a destination IP address), a source address 835 (e.g., a source IP address), and can include various encodings or formatting of bit fields to populate the shown packet characteristics 834. In some cases, the packet characteristics include a version identifier, a packet or payload length, a traffic class, a flow label, etc. In some cases, the payload data area 837 comprises a data structure that is encoded and/or formatted to fit into byte or word boundaries of the packet.

In some embodiments, hard-wired circuitry may be used in place of or in combination with software instructions to implement aspects of the disclosure. Thus, embodiments of the disclosure are not limited to any specific combination of hardware circuitry and/or software. In embodiments, the term "logic" shall mean any combination of software or hardware that is used to implement all or part of the disclosure.

The term "computer readable medium" or "computer usable medium" as used herein refers to any medium that participates in providing instructions to data processor 807 for execution. Such a medium may take many forms including, but not limited to, non-volatile media and volatile media. Non-volatile media includes, for example, optical or magnetic disks such as disk drives or tape drives. Volatile media includes dynamic memory such as a random access memory.

Common forms of computer readable media include, for example, floppy disk, flexible disk, hard disk, magnetic tape, or any other magnetic medium; CD-ROM or any other optical medium; punch cards, paper tape, or any other physical medium with patterns of holes; RAM, PROM, EPROM, FLASH-EPROM, or any other memory chip or cartridge, or any other non-transitory computer readable medium. Such data can be stored, for example, in any form of external data repository 831, which in turn can be formatted into any one or more storage areas, and which can comprise parameterized storage 839 accessible by a key (e.g., filename, table name, block address, offset address, etc.).

Execution of the sequences of instructions to practice certain embodiments of the disclosure are performed by a single instance of the computer system 8A00. According to certain embodiments of the disclosure, two or more instances of computer system 8A00 coupled by a communications link 815 (e.g., LAN, PTSN, or wireless network) may perform the sequence of instructions required to practice embodiments of the disclosure using two or more instances of components of computer system 8A00.

The computer system 8A00 may transmit and receive messages such as data and/or instructions organized into a data structure (e.g., communications packets). The data structure can include program instructions (e.g., application code 803), communicated through communications link 815 and communications interface 814. Received program code may be executed by data processor 807 as it is received and/or stored in the shown storage device or in or upon any other non-volatile storage for later execution. Computer system 8A00 may communicate through a data interface 833 to a database 832 on an external data repository 831. Data items in a database can be accessed using a primary key (e.g., a relational database primary key).

The processing element partition 801 is merely one sample partition. Other partitions can include multiple data processors, and/or multiple communications interfaces, and/or multiple storage devices, etc. within a partition. For example, a partition can bound a multi-core processor (e.g., possibly including embedded or co-located memory), or a partition can bound a computing cluster having plurality of computing elements, any of which computing elements are connected directly or indirectly to a communications link. A first partition can be configured to communicate to a second partition. A particular first partition and particular second partition can be congruent (e.g., in a processing element array) or can be different (e.g., comprising disjoint sets of components).

A module as used herein can be implemented using any mix of any portions of the system memory and any extent of hard-wired circuitry including hard-wired circuitry embodied as a data processor 807. Some embodiments include one or more special-purpose hardware components (e.g., power control, logic, sensors, transducers, etc.). Some embodiments of a module include instructions that are stored in a memory for execution so as to implement algorithms that facilitate operational and/or performance characteristics pertaining to dynamically managing cloud-based shared content using predictive modeling. A module may include one or more state machines and/or combinational logic used to implement or facilitate the operational and/or performance characteristics pertaining to dynamically managing cloud-based shared content using predictive modeling.

Various implementations of the database 832 comprise storage media organized to hold a series of records or files such that individual records or files are accessed using a name or key (e.g., a primary key or a combination of keys and/or query clauses). Such files or records can be organized into one or more data structures (e.g., data structures used to implement or facilitate aspects of dynamically managing cloud-based shared content using predictive modeling). Such files, records, or data structures can be brought into and/or stored in volatile or non-volatile memory. More specifically, the occurrence and organization of the foregoing files, records, and data structures improve the way that the computer stores and retrieves data in memory, for example, to improve the way data is accessed when the computer is performing operations pertaining to dynamically managing cloud-based shared content using predictive modeling, and/or for improving the way data is manipulated when performing computerized operations pertaining to applying a rule base and a predictive model to a set of content objects to identify one or more content management actions that serve to achieve quantitative objectives.

Figure 8B:
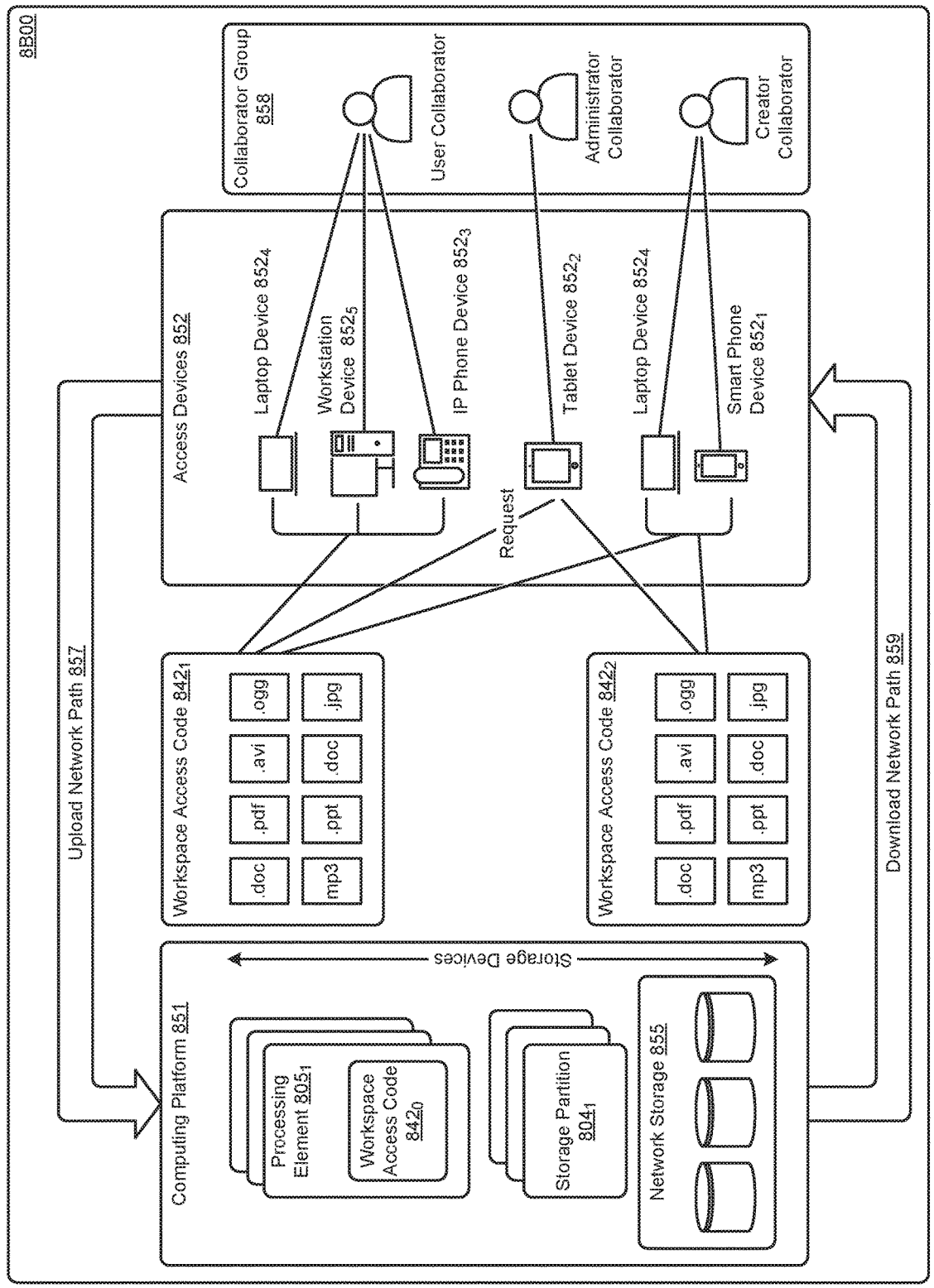

FIG. 8B depicts a block diagram of an instance of a cloud-based environment 8B00. Such a cloud-based environment supports access to workspaces through the execution of workspace access code (e.g., workspace access code $842_0$, workspace access code $842_1$, and workspace access code $842_2$). Workspace access code can be executed on any of the shown access devices 852 (e.g., laptop device $852_4$, workstation device $852_5$, IP phone device $852_3$, tablet device $852_2$, smart phone device $852_1$, etc.). A group of users can form a collaborator group 858, and a collaborator group can be composed of any types or roles of users. For example, and as shown, a collaborator group can comprise a user collaborator, an administrator collaborator, a creator collaborator, etc. Any user can use any one or more of the access devices, and such access devices can be operated concurrently to provide multiple concurrent sessions and/or other techniques to access workspaces through the workspace access code.

A portion of workspace access code can reside in and be executed on any access device. Any portion of the workspace access code can reside in and be executed on any computing platform 851, including in a middleware setting. As shown, a portion of the workspace access code resides in and can be executed on one or more processing elements (e.g., processing element $805_1$). The workspace access code can interface with storage devices such as the shown networked storage 855. Storage of workspaces and/or any constituent files or objects, and/or any other code or scripts or data can be stored in any one or more storage partitions (e.g., storage partition $804_1$). In some environments, a processing element includes forms of storage such as RAM and/or ROM and/or FLASH, and/or other forms of volatile and non-volatile storage.

A stored workspace can be populated via an upload (e.g., an upload from an access device to a processing element over an upload network path 857). A stored workspace can be delivered to a particular user and/or shared with other particular users via a download (e.g., a download from a processing element to an access device over a download network path 859).

In the foregoing specification, the disclosure has been described with reference to specific embodiments thereof. It will however be evident that various modifications and changes may be made thereto without departing from the broader spirit and scope of the disclosure. For example, the above-described process flows are described with reference to a particular ordering of process actions. However, the ordering of many of the described process actions may be changed without affecting the scope or operation of the disclosure. The specification and drawings are to be regarded in an illustrative sense rather than in a restrictive sense.

What is claimed is:

1. A method for managing one or more storage content objects stored in one or more storage devices in a cloud-based shared content management system, the method comprising:
maintaining a storage facility having a storage appliance that stores both a source object and at least one derivative object generated from the source object, wherein the derivative object is different from the source object;
determining one or more candidate eviction objects to evict from the storage facility, wherein at least one of the one or more candidate eviction objects is the at least one derivative object;
assigning an eviction action to the one or more candidate eviction objects, wherein a first eviction action is assigned to the at least one derivative object based at least in part on a comparison of a predicted retention cost for the at least one derivative object to a predicted disposal cost for the at least one derivative object wherein the predicted retention cost is based on at least one of a measured frequency of access or a predicted frequency of access and the predicted disposal cost is based on at least a cost to regenerate the at least one derivative object from the source object, the at least one derivative object is different from the source object and comprises only a subset of the source object or a transformed portion of the derivative object, the derivative object can be generated from the source object and the source object cannot be generated from the derivative object, the derivative object comprising a thumbnail or preview image;
determining one or more object management commands associated with the first eviction action assigned to the at least one derivative object;
initiating execution of at least one of the object management commands; and
wherein a first transformation function generates a first type of derivative object and a second transformation function generates a second type of derivative object, the first and second types of derivative objects being different types of derivative objects, the at least one derivative object comprising a first derivative object characterized as the first type of derivative object and a second derivative object characterized as the second type of derivative object, the first eviction action is assigned to the first derivative object based at least in part on the first derivative object being characterized as the first type of derivative object, a second eviction action is assigned to the second derivative object based at least in part on the second derivative object being characterized as the second type of derivative object, and the first eviction action and the second eviction action being different types of eviction actions.

2. The method of claim 1, wherein a plurality of candidate eviction objects are ranked by a respective cost reduction score, cost reduction scores being based on a difference between a corresponding predicted retention cost and a corresponding predicted disposal cost and corresponding eviction actions are executed in a rank order.

3. The method of claim 1, wherein the one or more object management commands comprises at least one of, a command to delete, a command to relocate, or a command to compress, or any combination thereof.

4. The method of claim 1, wherein the derivative object is the thumbnail.

5. The method of claim 1, wherein at least one of, an object management command, or an execution order of two or more of the one or more object management commands, is determined from one or more quantitative objectives derived from the predicted retention cost or the predicted disposal cost.

6. The method of claim 1, wherein the derivative object is a preview page of a source document.

7. The method of claim 1, wherein the derivative object comprises a preview page for each page of the source object.

8. The method of claim 1, further comprising recording a set of filer activity data that characterizes one or more filer access operations at the storage devices, and wherein at least one of, identifying the candidate eviction objects, or determining the one or more object management commands, is based at least in part on the set of filer activity data.

9. The method of claim 1, wherein a plurality of candidate eviction objects are plotted on a graph having a first dimension comprising predicted retention costs and a second dimension comprising predicted disposal costs, and an eviction score function based on the first dimension and the second dimension is used to determine which candidate evictions objects are eligible for eviction.

10. The method of claim 1, further comprising restoring, to at least one of the storage devices, one or more removed storage content objects.

11. The method of claim 10, wherein restoring the removed storage content objects is based at least in part on a set of filer activity data.

12. The method of claim 11, wherein restoring the removed storage content objects comprises regenerating a previously removed derivative object.

13. The method of claim 10, wherein object restoration rules govern restoration of the one or more removed storage content objects and the object restoration rules are configurable on a filer-by-filer basis.

14. The method of claim 1, further comprising delaying the execution of at least one of the object management commands until at least one eviction event condition is detected, wherein the eviction event condition is based at least in part on one or more filer performance measurements.

15. The method of claim 1, further comprising delaying the execution of at least one of the object management commands until at least one eviction event condition is detected and suspending execution of the at least one of the object management commands responsive to detecting a change to the eviction event condition.

16. A computer readable medium, embodied in a non-transitory computer readable medium, the non-transitory computer readable medium having stored thereon a sequence of instructions which, when stored in memory and executed by one or more processors causes the one or more processors to perform a set of acts for managing one or more storage content objects stored in one or more storage devices in a cloud-based shared content management system, the set of acts comprising:
maintaining a storage facility having a storage appliance that stores both a source object and at least one derivative object generated from the source object, wherein the derivative object is different from the source object;
determining one or more candidate eviction objects to evict from the storage facility, wherein at least one of the one or more candidate eviction objects is the at least one derivative object;
assigning an eviction action to the one or more candidate eviction objects, wherein a first eviction action is assigned to the at least one derivative object based at least in part on a comparison of a predicted retention cost for the at least one derivative object to a predicted disposal cost for the at least one derivative object wherein the predicted retention cost is based on at least one of a measured frequency of access or a predicted frequency of access and the predicted disposal cost is based on at least a cost to regenerate the at least one derivative object from the source object, the at least one derivative object is different from the source object and comprises only a subset of the source object or a transformed portion of the derivative object, the derivative object can be generated from the source object and the source object cannot be generated from the derivative object, the derivative object comprising a thumbnail or preview image;

determining one or more object management commands associated with the first eviction action assigned to the at least one derivative object;

initiating execution of at least one of the object management commands; and wherein a first transformation function generates a first type of derivative object and a second transformation function generates a second type of derivative object, the first and second types of derivative objects being different types of derivative objects, the at least one derivative object comprising a first derivative object characterized as the first type of derivative object and a second derivative object characterized as the second type of derivative object, the first eviction action is assigned to the first derivative object based at least in part on the first derivative object being characterized as the first type of derivative object, a second eviction action is assigned to the second derivative object based at least in part on the second derivative object being characterized as the second type of derivative object, and the first eviction action and the second eviction action being different types of eviction actions.

17. The computer readable medium of claim 16, wherein a plurality of candidate eviction objects are ranked by a respective cost reduction score, cost reduction scores being based on a difference between a corresponding predicted retention cost and a corresponding predicted disposal cost and corresponding eviction actions are executed in a rank order.

18. A system for managing one or more storage content objects stored in one or more storage devices in a cloud-based shared content management system, the system comprising:

a storage medium having stored thereon a sequence of instructions; and one or more processors that execute the sequence of instructions to cause the one or more processors to perform a set of acts, the set of acts comprising:

maintaining a storage facility having a storage appliance that stores both a source object and at least one derivative object generated from the source object, wherein the derivative object is different from the source object;

determining one or more candidate eviction objects to evict from the storage facility, wherein at least one of the one or more candidate eviction objects is the at least one derivative object;

assigning an eviction action to the one or more candidate eviction objects, wherein a first eviction action is assigned to the at least one derivative object based at least in part on a comparison of a predicted retention cost for the at least one derivative object to a predicted disposal cost for the at least one derivative object wherein the predicted retention cost is based on at least one of a measured frequency of access or a predicted frequency of access and the predicted disposal cost is based on at least a cost to regenerate the at least one derivative object from the source object, the at least one derivative object is different from the source object and comprises only a subset of the source object or a transformed portion of the derivative object, the derivative object can be generated from the source object and the source object cannot be generated from the derivative object, the derivative object comprising a thumbnail or preview image;

determining one or more object management commands associated with the first eviction action assigned to the at least one derivative object;

initiating execution of at least one of the object management commands; and wherein a first transformation function generates a first type of derivative object and a second transformation function generates a second type of derivative object, the first and second types of derivative objects being different types of derivative objects, the at least one derivative object comprising a first derivative object characterized as the first type of derivative object and a second derivative object characterized as the second type of derivative object, the first eviction action is assigned to the first derivative object based at least in part on the first derivative object being characterized as the first type of derivative object, a second eviction action is assigned to the second derivative object based at least in part on the second derivative object being characterized as the second type of derivative object, and the first eviction action and the second eviction action being different types of eviction actions.

19. The system of claim 18, wherein a plurality of candidate eviction objects are ranked by a respective cost reduction score, cost reduction scores being based on a difference between a corresponding predicted retention cost and a corresponding predicted disposal cost and corresponding eviction actions are executed in a rank order.

20. The method of claim 1, wherein the first type of derivative object is characterized as non-deterministic, wherein a non-deterministic derivative object is a derivative object where multiple derivative object generation executions on the source object produce varying results, and the second type of derivative object is characterized as deterministic, wherein a deterministic derivative object is a derivative object where multiple derivative object generation executions on the source object produce a same result.

21. The method of claim 20, wherein a first eviction action for the first type of derivative object corresponds to a fortify operation and a second eviction action for the second type of derivative object corresponds to a delete operation.

22. The method of claim 1, wherein a set of rules are applied to the one or more candidate eviction objects to satisfy one or more SLA constraints.

\* \* \* \* \*